United States Patent
Ito et al.

(10) Patent No.: US 12,238,936 B2
(45) Date of Patent: Feb. 25, 2025

(54) MEMORY DEVICE

(71) Applicant: Kioxia Corporation, Tokyo (JP)

(72) Inventors: Yuichi Ito, Seoul (KR); Taichi Igarashi, Seoul (KR)

(73) Assignee: Kioxia Corporation, Tokyo (JP)

( * ) Notice: Subject to any disclaimer, the term of this patent is extended or adjusted under 35 U.S.C. 154(b) by 545 days.

(21) Appl. No.: 17/684,736

(22) Filed: Mar. 2, 2022

(65) Prior Publication Data

US 2023/0071302 A1 Mar. 9, 2023

(30) Foreign Application Priority Data

Sep. 9, 2021 (JP) ................... 2021-146831

(51) Int. Cl.
| | |
|---|---|
| *H10B 61/00* | (2023.01) |
| *H10N 50/01* | (2023.01) |
| *H10N 50/80* | (2023.01) |
| *H10N 50/85* | (2023.01) |

(52) U.S. Cl.
CPC ............ *H10B 61/10* (2023.02); *H10N 50/01* (2023.02); *H10N 50/80* (2023.02); *H10N 50/85* (2023.02)

(58) Field of Classification Search
CPC ........ H10B 61/10; H10B 63/20; H10N 50/10; H10N 70/20; H10N 70/881; H10N 70/826; H01L 29/872; H01L 29/8615; H01L 29/47; H01L 29/24
See application file for complete search history.

(56) References Cited

U.S. PATENT DOCUMENTS

| | | |
|---|---|---|
| 10,217,934 B2 | 2/2019 | Yang et al. |
| 10,943,632 B2 | 3/2021 | Furuhashi |
| 11,217,745 B2 | 1/2022 | Ito et al. |
| 2021/0074908 A1 | 3/2021 | Oikawa et al. |
| 2021/0082999 A1 | 3/2021 | Toko et al. |

(Continued)

FOREIGN PATENT DOCUMENTS

| | | |
|---|---|---|
| JP | 2020155441 A | 9/2020 |
| JP | 2021044369 A | 3/2021 |
| JP | 2021044429 A | 3/2021 |

OTHER PUBLICATIONS

U.S. Appl. No. 17/202,151, First Named Inventor: Shogo Itai; Title: "Magnetic Memory Device"; filed Mar. 15, 2021.

(Continued)

*Primary Examiner* — Wasiul Haider
(74) *Attorney, Agent, or Firm* — Holtz, Holtz & Volek PC

(57) ABSTRACT

According to one embodiment, a memory device includes: a switching element including first and second conductive layers, and a variable resistive layer between the first and second conductive layers. The first or second conductive layers includes a first layer, a second layer between the first layer and the variable resistive layer, and a third layer between the first layer and the second layer. Each of the first and second layers is selected from a layer including carbon, a layer including nitrogen and carbon, a layer including nitrogen and titanium, a layer including nitrogen and tantalum, a layer including tungsten, a layer including nitrogen and tungsten, and a layer including platinum. The third layer includes at least one selected from lithium, sodium, magnesium, calcium, titanium, or lanthanum.

20 Claims, 19 Drawing Sheets

(56) References Cited

U.S. PATENT DOCUMENTS

2021/0083170 A1     3/2021    Sawada et al.
2022/0123207 A1*   4/2022    Min .................... H10N 70/231

OTHER PUBLICATIONS

U.S. Appl. No. 17/465,696, First Named Inventor: Taichi Igarashi; Title: "Magnetoresistance Memory Device and Method of Manufacturing Magnetoresistance Memory Device"; filed Sep. 2, 2021.
U.S. Appl. No. 17/469,778, First Named Inventor: Hiroshi Takehira; Title: "Switching Device and Resistance Variable Device"; filed Sep. 8, 2021.
U.S. Appl. No. 17/550,194, First Named Inventor: Taichi igarashi; Title: "Memory Device"; filed Dec. 14, 20221.
"Electronegativity" https://ja.wikigedia.org/wiki/%E9%9B%BB%E6%80%97%E9%99%80%E6%80%A7%E5%BA%A6; Wikipedia, Accessed: Feb. 22, 2022.
"Hydrogen storage alloy", https://ja.wikigedia.org/wiki/%E6%B0%B4%E7%B4%A0%E5%90%B8%E8%94%B5%E5%90%88%E9%87%91; Wikipedia, Accessed: Nov. 11, 2021.
"Hydrogen storage material", https://www.sigmaaldrich.com/jagan/materialscience/alternative/hydrogenstorage-learning/metal-hydrogen-storage.html: accessed Nov. 11, 2021.
Hasegawa, et al., "About hydrogen reduction of metal oxides and sulfides", Nihon Kinzoku Bulletin, vol. 13, pp. 277-285, 1974.
Kojima, et al., "Basics and applications of hydrogen storage alloys", Resource processing technology, vol. 46, No. 2 pp. 75-81, 1999.
Uesugi, et al., "Production of hydrogen storage material MgH2 and its application", Light Metal No. 60, No. 11, pp. 615-618, 2010.

* cited by examiner

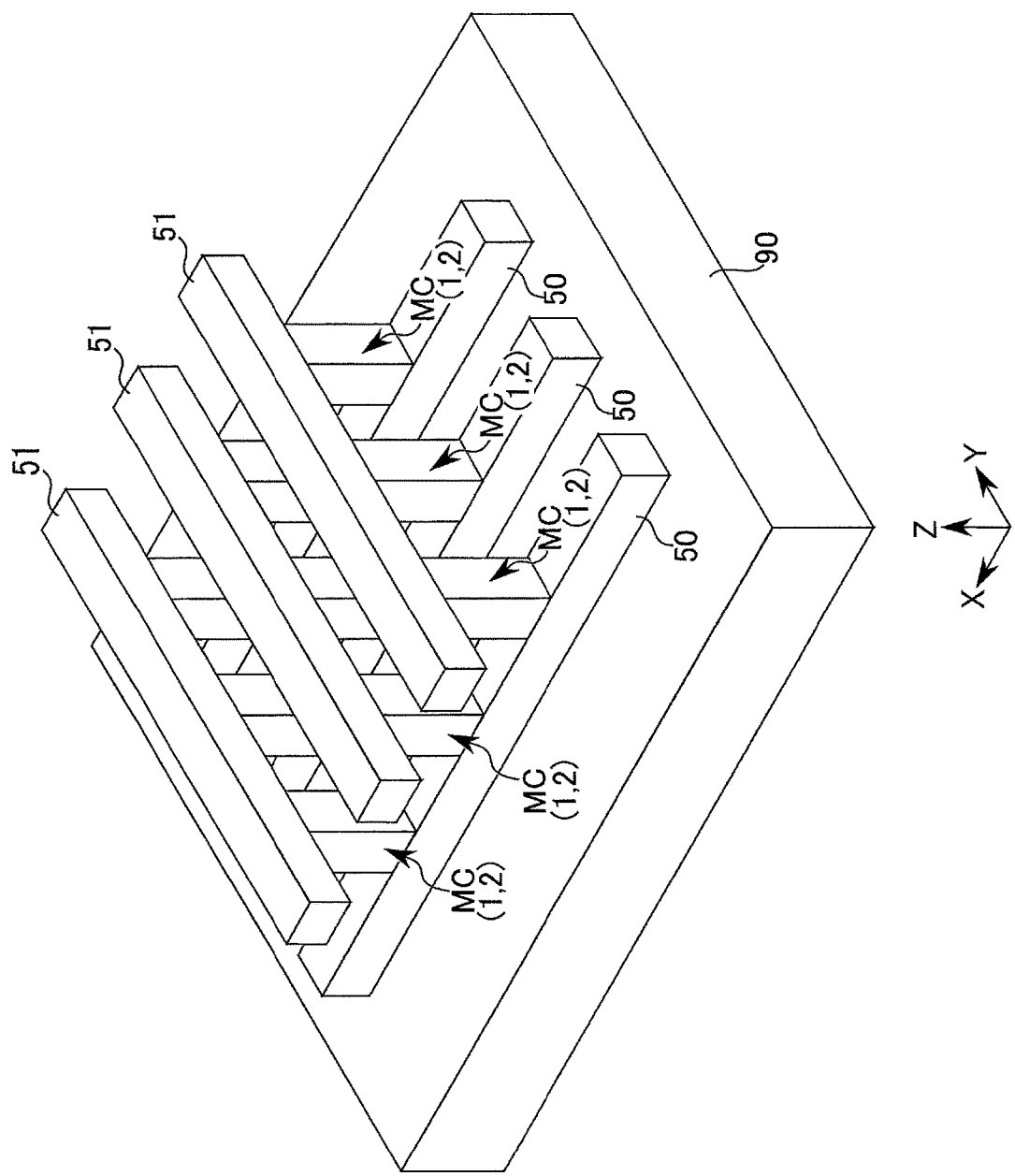
F I G. 3

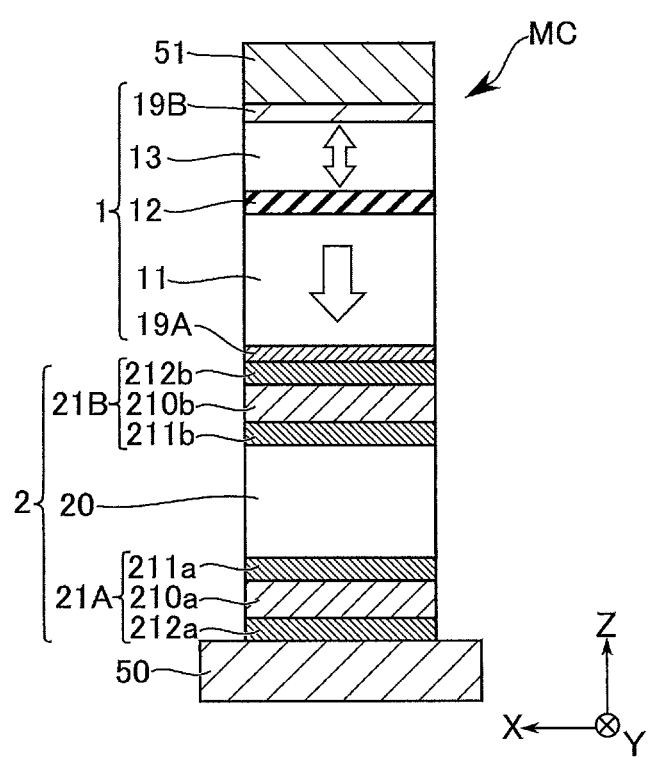
F I G. 6

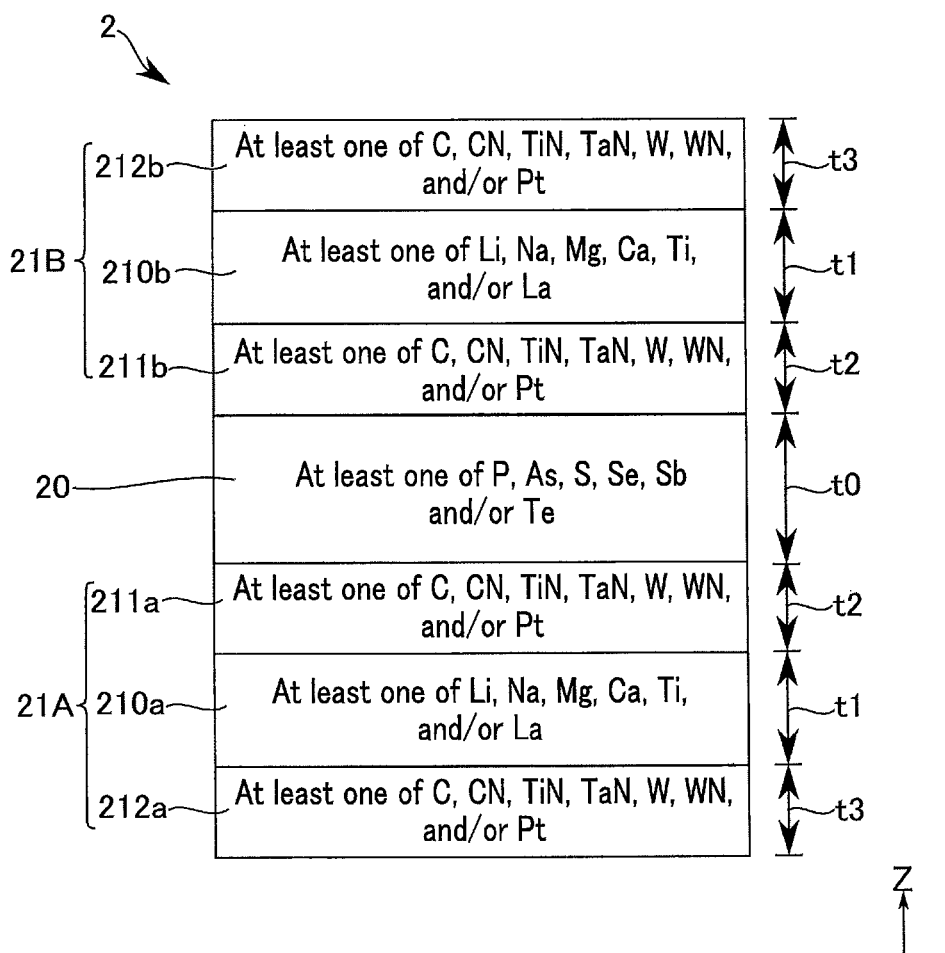
F I G. 7

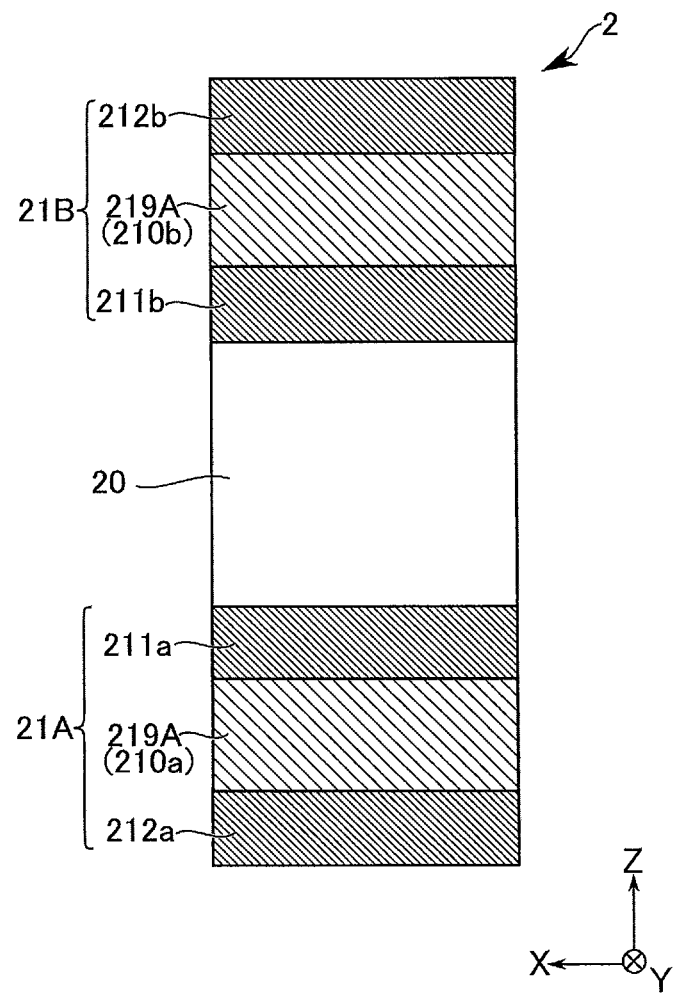
F I G. 9

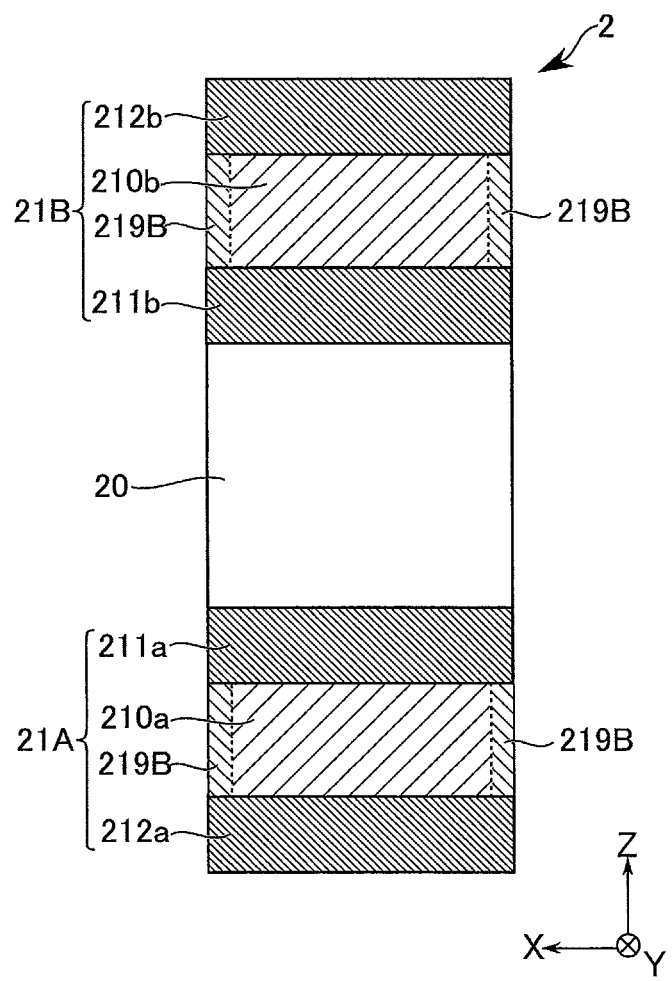
F I G. 10

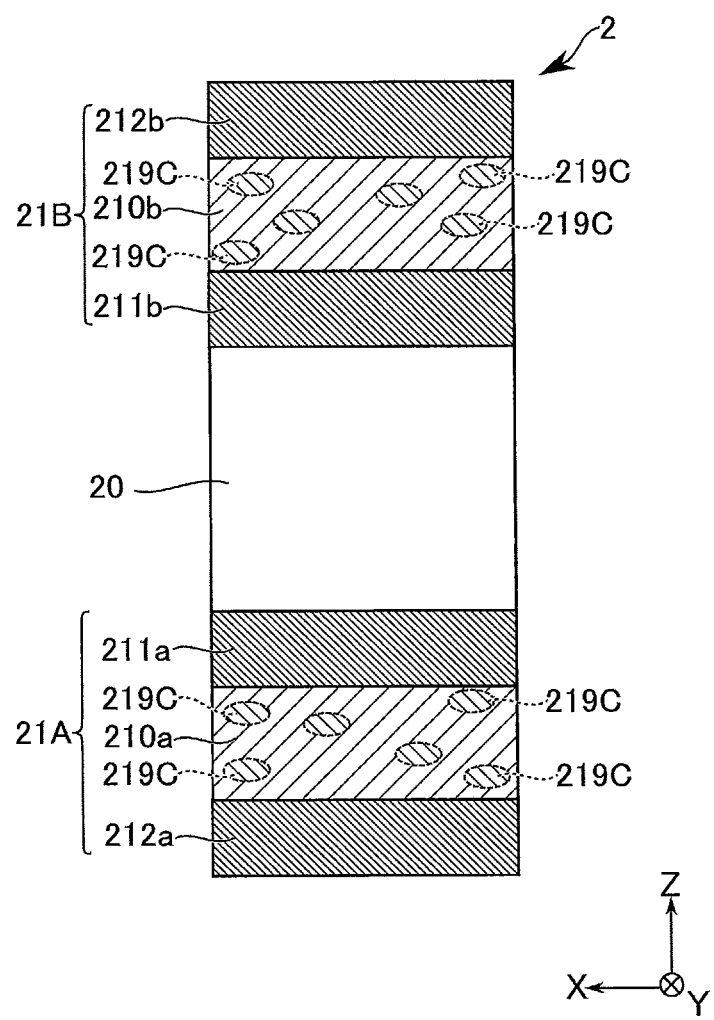
F I G. 11

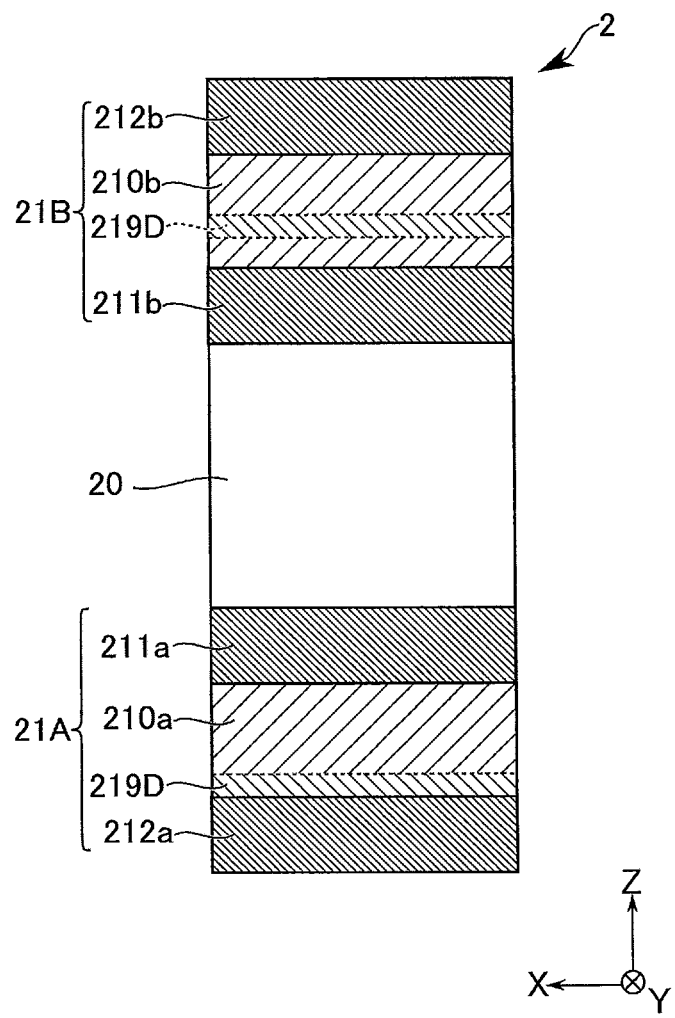
F I G. 12

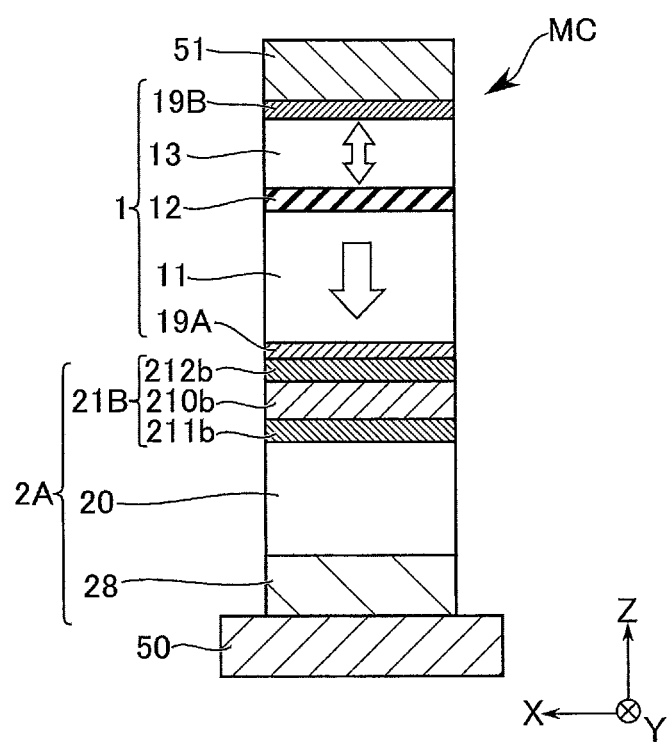
F I G. 17

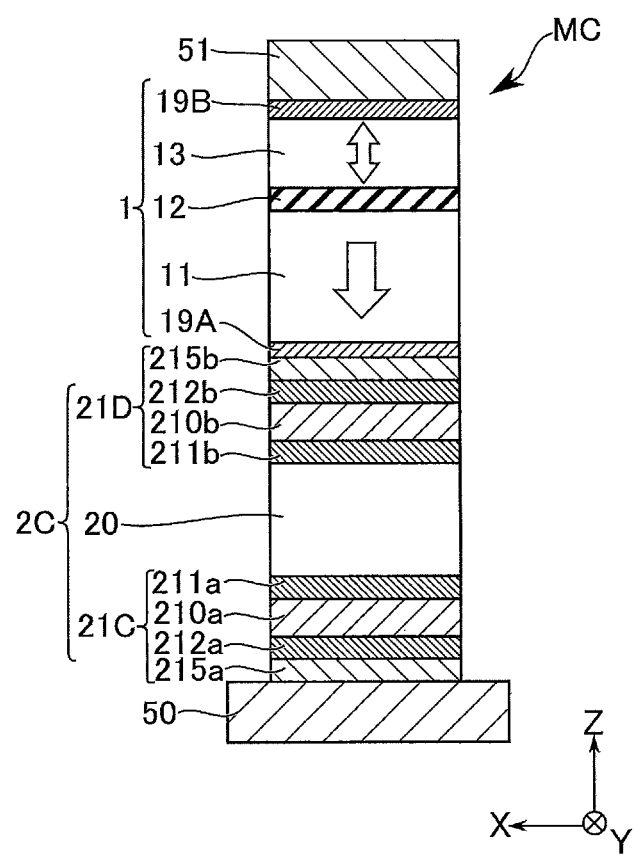
F I G. 19

MEMORY DEVICE

CROSS-REFERENCE TO RELATED APPLICATIONS

This application is based upon and claims the benefit of priority from prior Japanese Patent Application No. 2021-146831, filed Sep. 9, 2021, the entire contents of which are incorporated herein by reference.

FIELD

Embodiments described herein relate generally to a memory device.

BACKGROUND

A memory device in which a variable resistive element (e.g., a magnetoresistive effect element) is used as a memory element is known. To achieve improved device properties, extensive technical research and development are being conducted for such memory devices.

BRIEF DESCRIPTION OF THE DRAWINGS

FIG. 3 is an overhead view showing an exemplary structure of the memory cell array in the memory device according to the embodiment.

FIG. 6 is a schematic diagram showing an exemplary structure of a memory cell in the memory device according to the embodiment.

FIG. 7 is a schematic diagram showing an exemplary structure of a switching element in the memory device according to the embodiment.

FIG. 9 is a diagram for explaining the switching element in the memory device according to the embodiment.

FIG. 10 is a diagram for explaining the switching element in the memory device according to the embodiment.

FIG. 11 is a diagram for explaining the switching element in the memory device according to the embodiment.

FIG. 12 is a diagram for explaining the switching element in the memory device according to the embodiment.

FIG. 17 is a diagram showing a modification of the memory device according to an embodiment.

FIG. 19 is a diagram showing a modification of the memory device according to an embodiment.

DETAILED DESCRIPTION

The embodiments will be described in detail with reference to the drawings. The description will use the same reference signs for elements or components having the same or substantially the same functions and configurations.

For each embodiment below, where multiple elements or components of the same type may be involved (e.g., circuits, interconnects, a variety of voltages and signals, and so on), the description may add different numerals or alphabetic letters to the ends of the respective reference signs for discrimination therebetween. If discrimination between elements or components is not required, the description will omit such additional numerals or alphabetic letters (so that the elements, etc. are denoted only by the corresponding reference signs).

In general, according to one embodiment, a memory device includes: a switching element including a first conductive layer, a second conductive layer, and a variable resistive layer between the first conductive layer and the second conductive layer; and a memory element electrically connected in series with the switching element, wherein at least one of the first conductive layer or the second conductive layer includes a first layer, a second layer between the first layer and the variable resistive layer, and a third layer between the first layer and the second layer, each of the first layer and the second layer is selected from a layer including carbon, a layer including nitrogen and carbon, a layer including nitrogen and titanium, a layer including nitrogen and tantalum, a layer including tungsten, a layer including nitrogen and tungsten, and a layer including platinum, and the third layer includes at least one selected from lithium, sodium, magnesium, calcium, titanium, or lanthanum.

(1) Embodiments

A memory device 100 according to an embodiment will be described with reference to FIGS. 1 to 16.

[a] Examples of Configurations

FIGS. 1 to 12 will be referred to for describing exemplary configurations, etc. associated with the memory device 100 according to the embodiment.

(a-1) Overall Configuration

Figure 1:
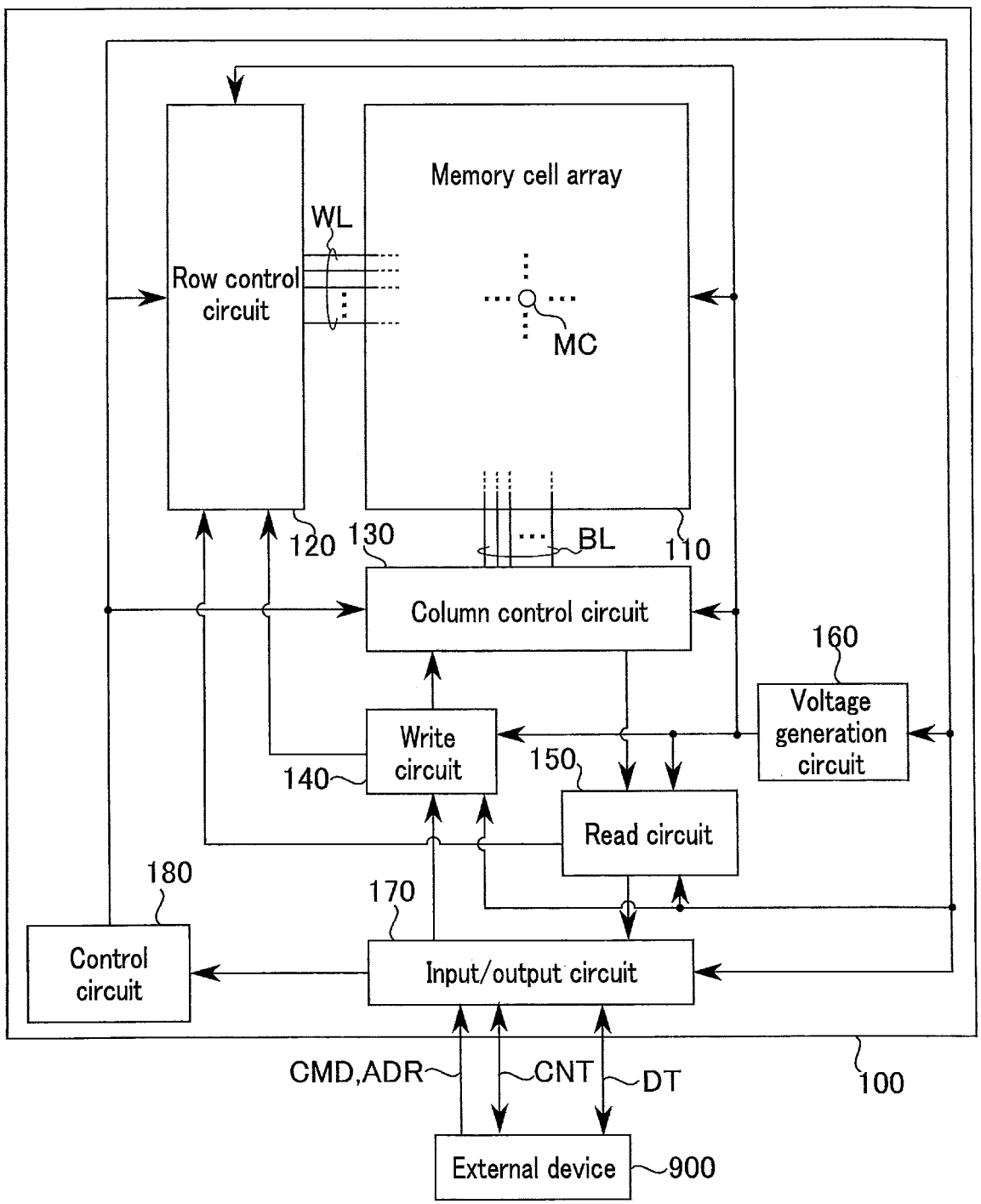
FIG. 1 is a block diagram showing an exemplary configuration of a memory device according to an embodiment.

FIG. 1 is a diagram showing an exemplary configuration of the memory device 100 according to the embodiment.

As shown in FIG. 1, the memory device 100 according to the embodiment is connected to a device 900 located outside the memory device 100 (hereinafter, an "external device 900").

The external device 900 sends a command CMD, an address ADR, and a control signal CNT to the memory device 100. Data DT is transferred between the memory device 100 and the external device 900. For write operations, the external device 900 sends data to be written in the memory device 100 (hereinafter, "write data") to the memory device 100. For read operations, the external device 900 receives data read at the memory device 100 (hereinafter, "read data") from the memory device 100.

The memory device 100 according to the present embodiment includes a memory cell array 110, a row control circuit 120, a column control circuit 130, a write circuit 140, a read circuit 150, a voltage generation circuit 160, an input/output circuit 170, and a control circuit 180.

The memory cell array 110 includes multiple memory cells MC, multiple word lines WL, and multiple bit lines BL.

The multiple memory cells MC are associated with multiple rows and columns in the memory cell array 110. Each memory cell MC is connected to a corresponding one of the multiple word lines WL. Also, each memory cell MC is connected to a corresponding one of the multiple bit lines BL.

The row control circuit 120 is connected to the memory cell array 110 via the word lines WL. The row control circuit 120 receives a row address of the address ADR (or a decoding result for a row address) in the memory cell array 110. The row control circuit 120 controls the multiple word lines WL based on the decoding results for row addresses. The row control circuit 120, in this manner, sets each of the multiple word lines WL (multiple rows) to either a selected state or a non-selected state. Hereinafter, a word line WL set to the selected state will be called a "selected word line WL", and the word lines WL other than the selected word line WL will be called "non-selected word lines WL".

The column control circuit 130 is connected to the memory cell array 110 via the bit lines BL. The column control circuit 130 receives a column address of the address ADR (or a decoding result for a column address) in the memory cell array 110. The column control circuit 130 controls the multiple bit lines BL based on the decoding results for column addresses. The column control circuit 130, in this manner, sets each of the multiple bit lines BL (multiple columns) to either a selected state or a non-selected state. Hereinafter, a bit line BL set to the selected state will be called a "selected bit line BL", and the bit lines BL other than the selected bit line BL will be called "non-selected bit lines BL".

The write circuit 140 writes data in the memory cells MC. The write circuit 140 applies a voltage (or a current) for data write to each of the selected word line WL and the selected bit line BL. Accordingly, selected memory cells MC are supplied with a given write voltage (or a given write current). The write circuit 140 is adapted to supply one of various write voltages to the selected memory cell MC according to the write data. For example, such various write voltages may each have a polarity (a bias direction) according to corresponding write data. In one example, the write circuit 140 includes components such as a write driver (not illustrated) and a write sink (not illustrated).

The read circuit 150 reads data from the memory cells MC. The read circuit 150 amplifies a signal that has been output to the selected bit line BL from the selected memory cell MC. The read circuit 150 specifies data in the memory cell MC based on the amplified signal. In one example, the read circuit 150 includes components such as a preamplifier (not illustrated), a sense amplifier (not illustrated), a read driver (not illustrated), and a read sink (not illustrated).

The voltage generation circuit 160 uses a source voltage from the external device 900 to generate voltages for the memory cell array 110 to perform various operations. In one instance, the voltage generation circuit 160 generates various voltages for use in write operations. The voltage generation circuit 160 outputs generated voltages to the write circuit 140. In another instance, the voltage generation circuit 160 generates various voltages for use in read operations. The voltage generation circuit 160 outputs generated voltages to the read circuit 150.

The input/output circuit 170 functions as an interface circuit between the memory device 100 and the external device 900 for each of the signals such as ADR, CMD, CNT, and DT. The input/output circuit 170 passes the address ADR from the external device 900 to the control circuit 180. The input/output circuit 170 passes the command CMD from the external device 900 to the control circuit 180. The input/output circuit 170 allows the control signal CNT, which may be of various contents, to be communicated between the external device 900 and the control circuit 180. The input/output circuit 170 passes write data DT from the external device 900 to the write circuit 140. The input/output circuit 170 passes data DT from the read circuit 150 as read data to the external device 900.

The control circuit 180 (also called a "sequencer", a "state machine", or an "internal controller") decodes the command CMD. Based on the result of decoding the command CMD, and also based on the control signal CNT, the control circuit 180 controls operations of the components in the memory device 100, including the row control circuit 120, the column control circuit 130, the write circuit 140, the read circuit 150, the voltage generation circuit 160, and the input/output circuit 170. The control circuit 180 decodes the address ADR. The control circuit 180 sends the result of decoding the address ADR to the row control circuit 120, the column control circuit 130, etc. In one example, the control circuit 180 includes components such as a register circuit (not illustrated) for temporary storage of the command CMD and the address ADR. Note that such a register circuit, a circuit for decoding the command CMD (a command decoder), and a circuit for decoding the address ADR (an address decoder) may be disposed outside the control circuit 180 and within the memory device 100.

(a-2) Memory Cell Array

FIGS. 2 to 5 will be referred to for describing an exemplary configuration, etc. of the memory cell array 110 in the memory device 100 according to the embodiment.

Figure 2:
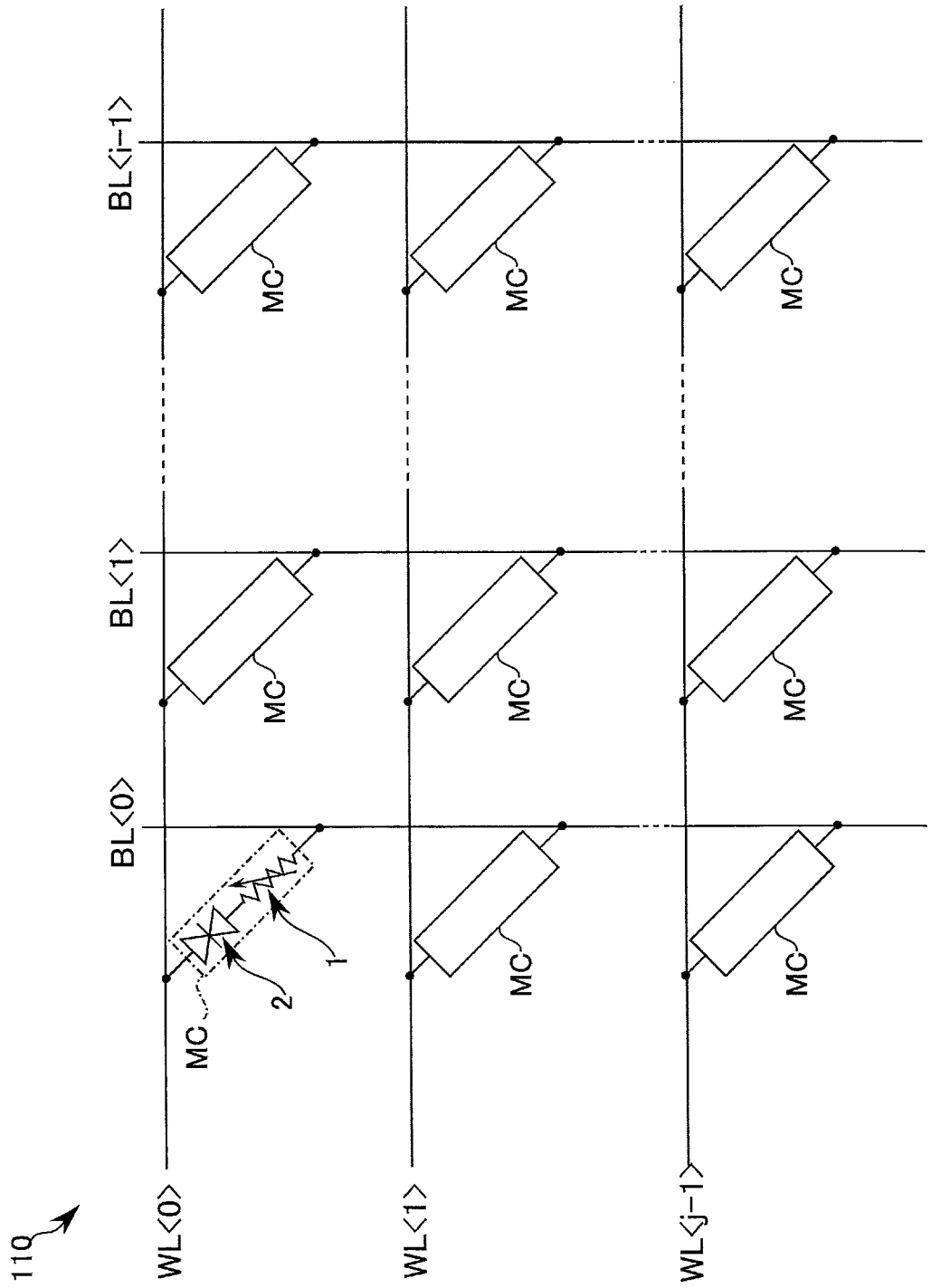
FIG. 2 is a diagram showing an exemplary configuration of a memory cell array in the memory device according to the embodiment.

FIG. 2 is an equivalent circuit diagram showing an exemplary configuration of the memory cell array 110 in the memory device 100 according to the embodiment.

As shown in FIG. 2, multiple memory cells MC in the memory cell array 110 are arranged in a matrix pattern. Each memory cell MC is connected to a corresponding one of multiple bit lines BL (BL<0>, BL<1>, ... BL<i–1>) and a corresponding one of multiple word lines WL (WL<0>, WL<1>, ... WL<j–1>). Here, i and j are each an integer equal to or greater than 2.

The memory cells MC each include a memory element 1 and a switching element 2.

The memory element 1 is, for example, a variable resistive element. The memory element 1 changes its resistive state to one of multiple resistive states (e.g., a low resistive state and a high resistive state) according to a supplied voltage (or current). The memory element 1 can store data by associating the resistive state of the element 1 with data (e.g., data "0" or data "1").

The switching element 2 (also called a "selector element" or simply a "selector") functions as a selecting element for the respective memory cell MC. The switching element 2 functions to control the supply of a voltage (or a current) to the corresponding memory element 1 for operations of writing data to this memory element 1 and reading data from this memory element 1.

In one example, when a voltage applied to a given memory cell MC is lower than the threshold voltage of the switching element 2 in this memory cell MC, the switching element 2 is set to an off state (a high resistive state, a non-conductive state). The switching element 2 here blocks the supply of a voltage (a current) to the memory element 1. When a voltage applied to a given memory cell MC is equal to or higher than the threshold voltage of the switching element 2 in this memory cell MC, the switching element 2 is set to an on state (a low resistive state, a conductive state). The switching element 2 here supplies a voltage (a current) to the memory element 1.

The switching element 2 is adapted to switch between allowing and not allowing a current flow in the corresponding memory cell MC according to the size of the voltage applied to the memory cell MC, regardless of the direction of the current flowing in the memory cell MC.

The switching element 2 is, for example, a two-terminal type element.

Figure 4:
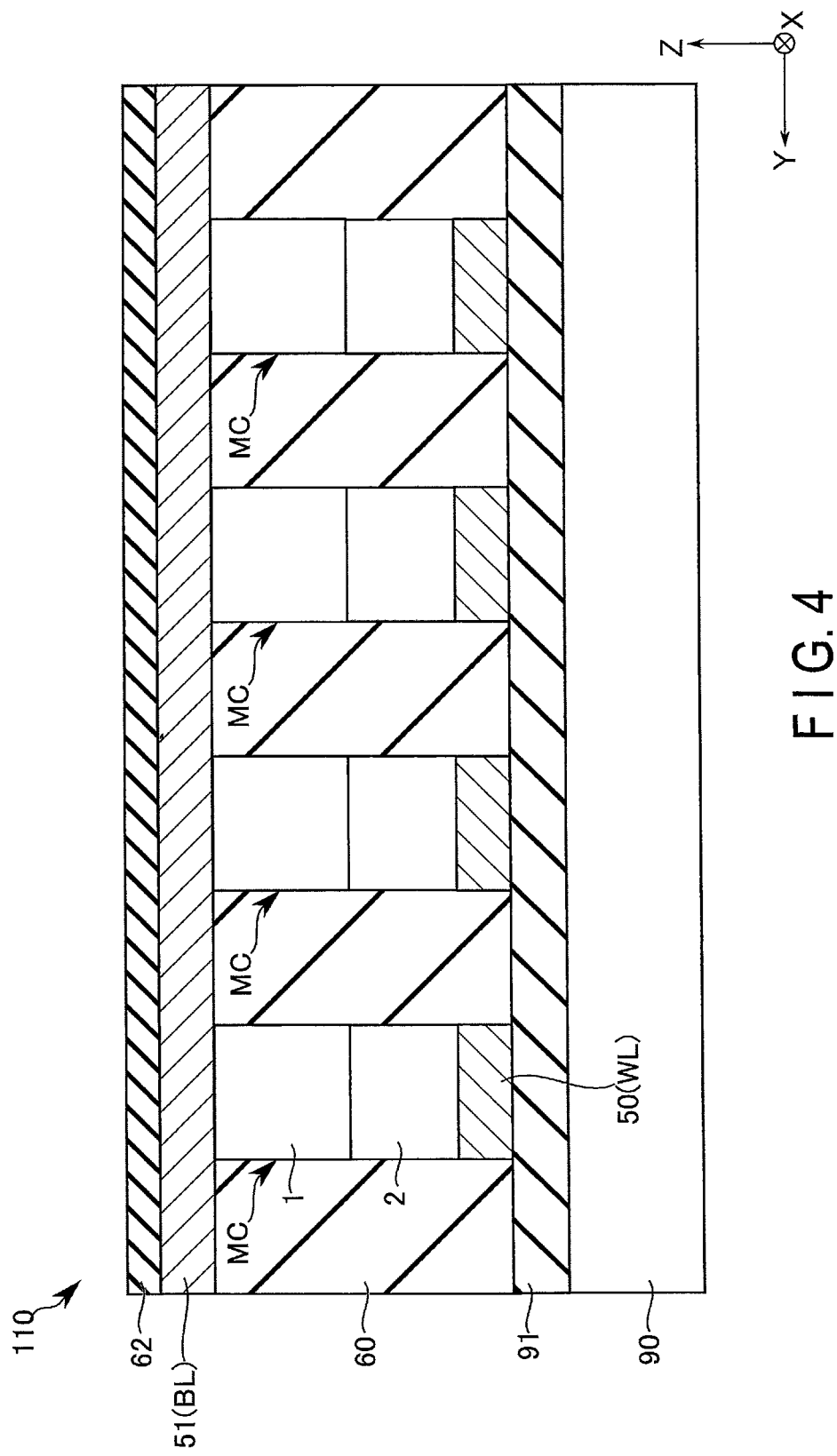
FIG. 4 is a sectional view showing an exemplary structure of the memory cell array in the memory device according to the embodiment.
Figure 5:
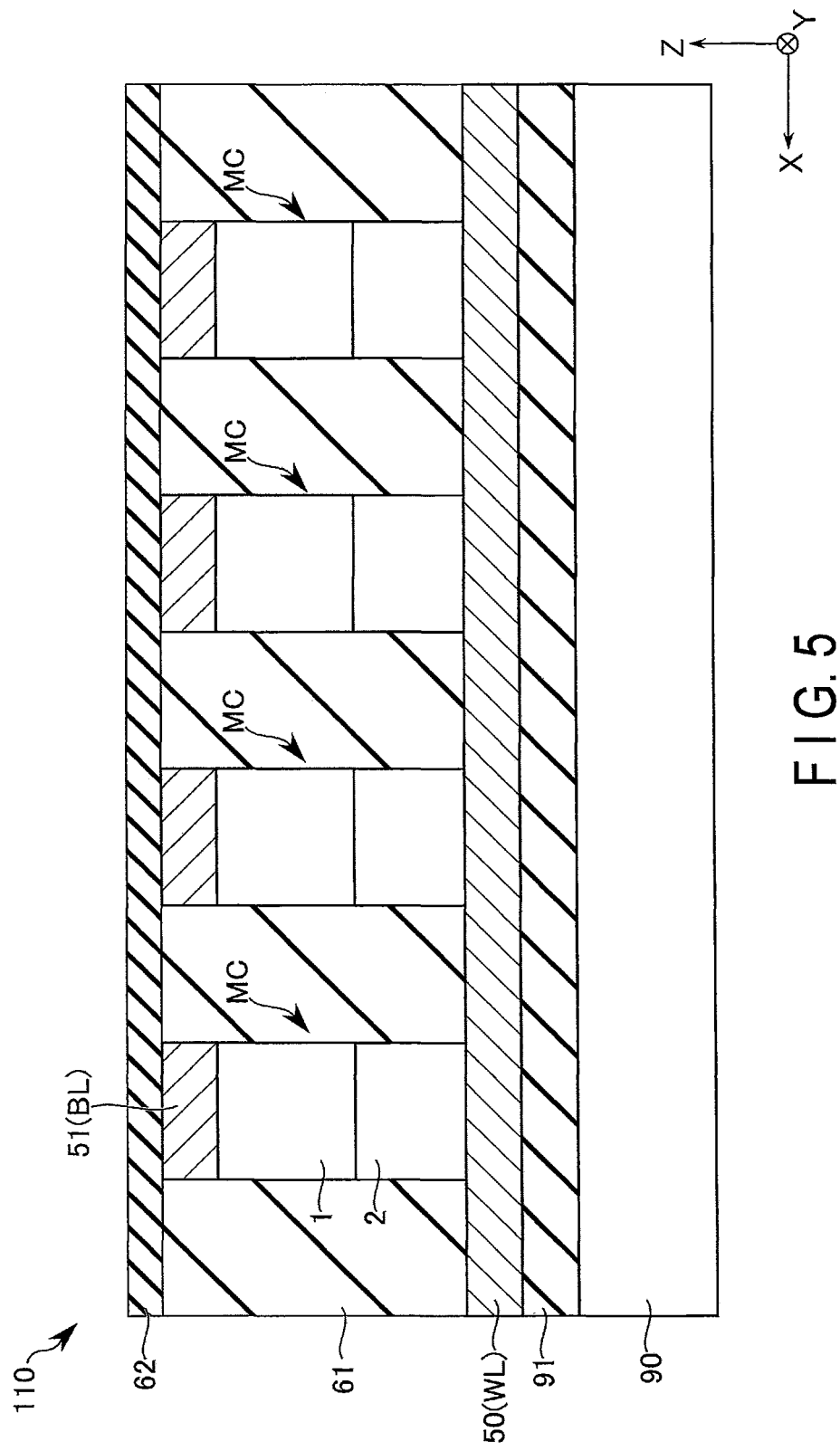
FIG. 5 is a sectional view showing an exemplary structure of the memory cell array in the memory device according to the embodiment.

FIGS. 3 to 5 are diagrams for explaining exemplary structures of the memory cell array 110 in the memory device 100 according to the embodiment. FIG. 3 is an overhead view for explaining an exemplary structure of the memory cell array 110. FIG. 4 is a schematic sectional view showing a sectional structure of the memory cell array 110, taken along a first direction (a first axis). FIG. 5 is a schematic sectional view showing a sectional structure of the memory cell array 110, taken along a second direction (a second axis). In the examples shown in FIGS. 3 to 5, the first direction conforms to a Y direction, and the second direction conforms to an X direction.

As shown in FIGS. 3 to 5, the memory cell array 110 is provided above the top face of a substrate 90.

The X direction is a direction parallel to the top face of the substrate 90. The Y direction is a direction parallel to the top face of the substrate 90 and orthogonal to the X direction. Hereinafter, a plane parallel to the top face of the substrate 90 will be called an X-Y plane. A direction (an axis) perpendicular to the X-Y plane will be called a Z direction (a Z axis). A plane extending along the X direction and the Z direction will be called an X-Z plane. A plane extending along the Y direction and the Z direction will be called a Y-Z plane.

Multiple interconnects 50 (conductive layers) are provided above the top face of the substrate 90 in the Z direction via an insulation layer 91. The interconnects 50 are arranged along the Y direction. The interconnects 50 each extend in the X direction. The interconnects 50 function as, for example, respective word lines WL.

Multiple interconnects 51 (conductive layers) are provided above the multiple interconnects 50 in the Z direction. The interconnects 51 are arranged along the X direction. The interconnects 51 each extend in the Y direction. The interconnects 51 function as, for example, respective bit lines BL.

Multiple memory cells MC are provided between the interconnects 50 and the interconnects 51. The memory cells MC are arranged in a matrix pattern within the X-Y plane.

The memory cells MC arranged along the X direction are disposed on one interconnect 50. The memory cells MC arranged along the X direction are thus connected to the common word line WL.

The memory cells MC arranged along the Y direction are disposed under one interconnect 51. The memory cells MC arranged along the Y direction are thus connected to the common bit line BL.

In one example where the memory cell array 110 has a circuit configuration as shown in FIG. 2, each switching element 2 is provided below the corresponding memory element 1 in the Z direction. The switching element 2 here is arranged between the memory element 1 and the interconnect (word line) 50. The memory element 1 is arranged between the interconnect (bit line) 51 and the switching element 2.

As such, each memory cell MC is constituted as a stack of the memory element 1 and the switching element 2. With such memory cells MC, the memory cell array 110 has a stack type structure. Note that the memory cells MC may have a tapered sectional shape according to the processes (e.g., an etching method) employed for forming the memory cell array 110.

FIGS. 4 and 5 assume an example where the insulation layer 91 is disposed between the multiple interconnects 50 and the substrate 90. If the substrate 90 is a semiconductor substrate, one or more field-effect transistors (not illustrated) may be provided on one or more semiconductor regions of the top face of the substrate 90. The field-effect transistors are covered by the insulation layer 91. The field-effect transistors on the substrate 90 are circuit components of the row control circuit 120, etc. The field-effect transistors are connected to the memory cell array 110 via contact plugs (not illustrated) and interconnects (not illustrated) formed in the insulation layer 91. Such circuits for controlling operations of the memory cell array 110 may be provided below the memory cell array 110 in the Z direction. Note that if the substrate 90 is a substrate with an insulating property, the multiple interconnects 50 may be disposed directly on the top face of the substrate 90 without the intervening insulation layer 91.

The stack type memory cell array 110 is not limited to the exemplary circuit configurations and structures shown in FIGS. 2 to 5. The circuit configuration and structure of the memory cell array 110 may be discretionarily modified according to the connections of the memory element 1 and the switching element 2 to the corresponding bit line BL and the corresponding word line WL. For example, the memory cell array 110 having a circuit configuration as shown in FIG. 2 may adopt a structure other than the exemplary structures shown in FIGS. 3 to 5. As one example, each switching element 2 may be provided above the corresponding memory element 1 in the Z direction. In this case, the interconnects 50 are used as bit lines BL and the interconnects 51 are used as word lines WL.

(a-3) Memory Cell

FIG. 6 is a sectional view showing an exemplary structure of a memory cell MC in the memory device 100 according to the embodiment.

As shown in FIG. 6, in the memory cell MC as a stack, the memory element 1 and the switching element 2 are arranged along the Z direction. The description of this embodiment assumes that the memory element 1 is disposed above the switching element 2 in the Z direction.

In one exemplary implementation, the variable resistive element serving as the memory element 1 is a magnetoresistive effect element. In such an implementation, the memory device 100 according to the embodiment is a magnetic memory as represented by a magnetoresistive random access memory (MRAM).

<Exemplary Structure of Magnetoresistive Effect Element>

In one example, the magnetoresistive effect element 1 at least includes two magnetic layers 11 and 13 and a non-magnetic layer 12. The non-magnetic layer 12 is arranged between the two magnetic layers 11 and 13 in the Z direction. In the example shown in FIG. 6, these layers are arranged in the order of the magnetic layer 11, the non-magnetic layer 12, and the magnetic layer 13 along the Z direction from the side of the word line WL (i.e., the interconnect 50) toward the side of the bit line BL (i.e., the interconnect 51).

The two magnetic layers 11 and 13 and the non-magnetic layer 12 form a magnetic tunnel junction (MTJ). Hereinafter, the magnetoresistive effect element 1 including this MTJ will also be called an "MTJ element 1". The non-magnetic layer 12 in the MTJ element 1 will also be called a "tunnel barrier layer 12".

Examples of the magnetic layers 11 and 13 include a ferromagnetic layer including (containing), for example, cobalt (Co), iron (Fe), and/or boron (B), etc. The magnetic layers 11 and 13 may each be a mono-layer film (e.g., an alloy film) or a multi-layer film (e.g., an artificial lattice film). Examples of the tunnel barrier layer 12 include an insulation layer including (containing) magnesium oxide. The tunnel barrier layer 12 may be a mono-layer film or a multi-layer film.

The present embodiment assumes that the MTJ element 1 is a magnetoresistive effect element of a perpendicular magnetization type.

For example, the magnetic layers 11 and 13 each have a perpendicular magnetic anisotropy. The direction of easy magnetization axis of the magnetic layers 11 and 13 is perpendicular to the layer faces (film surfaces) of the magnetic layers 11 and 13. The magnetic layers 11 and 13 each have a magnetization perpendicular to the layer faces of the magnetic layers 11 and 13. The magnetization direction of each of the magnetic layers 11 and 13 is parallel to the direction (Z direction) in which the magnetic layers 11 and 13 are arranged.

One of the two magnetic layers 11 and 13 has an invariable magnetization direction, while the other has a variable magnetization direction. The MTJ element 1 is adapted to take multiple resistive states (resistance values) according to the relative relationship (magnetization alignment) between the magnetization direction of one magnetic layer and the magnetization direction of the other magnetic layer.

In the example shown in FIG. 6, the magnetization direction of the magnetic layer 13 is variable. The magnetization direction of the magnetic layer 11 is invariable (in a fixed state). Hereinafter, the magnetic layer 13 having a variable magnetization direction will be called a "storage layer 13". The magnetic layer 11 having an invariable (fixed) magnetization direction will be called a "reference layer 11". There are other terms for the storage layer 13, such as a "free layer", a "free magnetization layer", and a "variable magnetization layer". There are other terms for the reference layer 11, such as a "pin layer", a "pinned layer", an "invariable magnetization layer", and a "fixed magnetization layer".

In the context of this embodiment, an invariable or a fixed-state magnetization direction of the reference layer (one magnetic layer) means that a current or a voltage supplied to the MTJ element 1 for changing the magnetization direction of the storage layer 13 does not entail a change in the magnetization direction of the reference layer 11 before and after the supply of the current or the voltage.

When the magnetization direction of the storage layer 13 conforms to the magnetization direction of the reference layer 11 (namely, when the magnetization alignment state of the MTJ element 1 is a parallel alignment state), the MTJ element is in a first resistive state. When the magnetization direction of the storage layer 13 differs from the magnetization direction of the reference layer 11 (namely, when the magnetization alignment state of the MTJ element 1 is an anti-parallel alignment state), the MTJ element is in a second resistive state different from the first resistive state. The MTJ element 1 in the second resistive state (the anti-parallel alignment state) has a resistance value higher than that of the MTJ element 1 in the first resistive state (the parallel alignment state). Hereinafter, for the magnetization alignment state of the MTJ element 1, the parallel alignment state may also be called a "P state", and the anti-parallel alignment state may also be called an "AP state".

In one example, the MTJ element 1 includes two electrodes 19A and 19B. The magnetic layers 11 and 13 and the tunnel barrier layer 12 are arranged between the two electrodes 19A and 19B in the Z direction. The reference layer 11 is arranged between the electrode 19A and the tunnel barrier layer 12. The storage layer 13 is arranged between the electrode 19B and the tunnel barrier layer 12.

For exemplary implementation, a shift cancellation layer (not illustrated) may be provided within the MTJ element 1. In such an implementation, the shift cancellation layer is arranged between the reference layer 11 and the electrode 19A. The shift cancellation layer is a magnetic layer for mitigating the influence of a stray magnetic field from the reference layer 11. When the MTJ element 1 includes the shift cancellation layer, a non-magnetic layer (not illustrated) is provided between the shift cancellation layer and the reference layer 11. The non-magnetic layer is, for example, a metal layer such as a ruthenium (Ru) layer. The shift cancellation layer is anti-ferromagnetically bonded to the reference layer 11 via the non-magnetic layer. Accordingly, the stack including the reference layer 11 and the shift cancellation layer forms a synthetic anti-ferromagnetic (SAF) structure. In the SAF structure, the shift cancellation layer has a magnetization direction opposite to the magnetization direction of the reference layer 11. The SAF structure contributes to the stable fixation of the magnetization direction of the reference layer 11. Note that the two magnetic layers and the non-magnetic layer, together forming the SAF structure, may be collectively called a "reference layer".

For exemplary implementation, the MTJ element 1 may include at least one of a base layer (not illustrated) and/or a cap layer (not illustrated). The base layer is arranged between the magnetic layer 11 (the reference layer in this example) and the electrode 19A. The base layer is a non-magnetic layer, such as a conductive compound layer. The base layer is a layer for improving the properties (e.g., crystallinity and/or magnetic characteristics) of the magnetic layer 11 adjacent to the base layer. The cap layer is arranged between the magnetic layer 13 (the storage layer in this example) and the electrode 19B. The cap layer is a non-magnetic layer, such as a conductive compound layer. The cap layer is a layer for improving the properties (e.g., crystallinity and magnetic characteristics) of the magnetic layer 13 adjacent to the cap layer. Note that the base layer and the cap layer may be handled as parts of the respective electrodes 19 (19A and 19B).

<Exemplary Structure of Switching Element>

When the switching element 2 is a two-terminal type element as shown in FIG. 6, the switching element 2 at least includes a variable resistive layer 20 (also called a "switching layer 20" or a "selector layer 20" below) and two electrodes 21A and 21B (electrode layers). The switching layer 20 is provided between the two electrodes 21A and 21B in the Z direction. The switching layer 20 is adapted to take multiple resistive states.

In the example shown in FIG. 6, the electrode 21A is arranged below the switching layer 20 in the Z direction, and the electrode 21B is arranged above the switching layer 20 in the Z direction. In one example, the electrode 21A is arranged between the interconnect 50 and the switching layer 20. The electrode 21B is arranged between the switching layer 20 and the MTJ element 1.

The switching layer 20 is connected to the interconnect 50 via the electrode 21A. Also, the switching layer 20 is connected to the MTJ element 1 via the electrode 21B.

Hereinafter, among the two electrodes 21A and 21B included in the switching element 2, the electrode 21A arranged on the side closer to the substrate 90 may also be called a "lower electrode 21A". Among the two electrodes 21A and 21B, the electrode 21B arranged above the lower electrode 21A in the Z direction (that is, the electrode on the side opposite the substrate 90) may also be called an "upper electrode 21B".

The switching layer 20 changes its resistive state to a high resistive state (a non-conductive state) or a low resistive state (a conductive state) according to the voltage applied to the switching element 2 (the memory cell MC). The switching layer 20 being in the high resistive state represents the switching element 2 being in an off state. The switching layer 20 being in the low resistive state represents the switching element 2 being in an on state.

When the corresponding memory cell MC is set to the selected state, the switching element 2 is turned on, and therefore, the resistive state of the switching layer 20 is in the low resistive state. When the corresponding memory cell MC is set to the non-selected state, the switching element 2 is turned off, and therefore, the resistive state of the switching layer 20 is in the high resistive state. Note that the changes in the resistive state of the switching layer 20 may be made dependent on a current flowing in the switching element 2 (the memory cell MC), e.g., the size of the current, according to the materials of the switching layer 20.

In the present embodiment, the electrodes 21A and 21B of the switching element 2 each have a stack structure including multiple layers 210 (210a or 210b), 211 (211a or 211b), and 212 (212a or 212b). In each of the electrodes 21A and 21B, the layer 210 is arranged between the layer 211 and the layer 212. The layers 210, 211, and 212 are, for example, conductive layers.

In the present embodiment, the layer 210 includes (contains) a material that can adsorb and/or store hydrogen (hereinafter, the material will be called a "hydrogen storing material"). For discriminating purposes, the description may also call the layer 210 a "hydrogen storing layer 210".

The layers 211 and 212 include (contain) a material that can prevent other layers (e.g., the hydrogen storing layer 210) from causing chemical reactions (e.g., oxidation or nitriding). In exemplary implementations, the layers 211 and 212 prevent oxidation of the hydrogen storing layer 210. For discriminating purposes, the description may call the layers 211 and 212 "oxidation preventing layers 211 and 212" (or "reaction preventing layers 211 and 212").

The lower electrode 21A includes a hydrogen storing layer 210a and two oxidation preventing layers 211a and 212a. The hydrogen storing layer 210a and the two oxidation preventing layers 211a and 212a are stacked in the Z direction. One of the two oxidation preventing layers 211a and 212a, namely, the oxidation preventing layer 212a, is provided below the switching layer 20 in the Z direction. The hydrogen storing layer 210a is arranged between the oxidation preventing layer 212a and the switching layer 20. The oxidation preventing layer 212a is arranged between the hydrogen storing layer 210a and the interconnect 50. The other oxidation preventing layer 211a is provided between the hydrogen storing layer 210a and the switching layer 20.

The lower electrode 21A closely contacts the switching layer 20 via the entire interface between the lower electrode 21A and the switching layer 20. For example, the oxidation preventing layer 211a is in direct contact with the entire bottom face of the switching layer 20 without any voids occurring between the oxidation preventing layer 211a and the switching layer 20.

The upper electrode 21B includes a hydrogen storing layer 210b and two oxidation preventing layers 211b and 212b. The hydrogen storing layer 210b and the two oxidation preventing layers 211b and 212b are stacked in the Z direction. One of the two oxidation preventing layers 211b and 212b, namely, the oxidation preventing layer 212b, is provided above the switching layer 20 in the Z direction. The oxidation preventing layer 212b is arranged between the hydrogen storing layer 210b and the MTJ element 1 (the electrode 19A). The hydrogen storing layer 210b is arranged between the oxidation preventing layer 212b and the switching layer 20. The other oxidation preventing layer 211b is provided between the hydrogen storing layer 210b and the switching layer 20.

The upper electrode 21B closely contacts the switching layer 20 via the entire interface between the upper electrode 21B and the switching layer 20. For example, the oxidation preventing layer 211b is in direct contact with the entire upper face of the switching layer 20 without any voids occurring between the oxidation preventing layer 211b and the switching layer 20.

As such, in each electrode 21 of the switching element 2, the hydrogen storing layer 210 is sandwiched between the two oxidation preventing layers 211 and 212. The hydrogen storing layer 210 is adjacent to the switching layer 20 via the oxidation preventing layer 211.

FIG. 7 will be referred to for describing materials used for the switching element 2 in the MRAM 100 according to the embodiment. FIG. 7 shows examples of the materials employed for the respective layers 20, 210, 211, and 212 of the switching element 2 in the MRAM 100 according to the embodiment.

As shown in FIG. 7, the switching layer 20 includes, as its constituting element or elements, at least one selected from phosphorus (P), arsenic (As), sulfur (S), selenium (Se), antimony (Sb) and/or tellurium (Te).

The switching layer 20 is formed of a material which is, for example, an insulator containing a dopant (an impurity).

One example of such an insulator used for the switching layer 20 is a silicon oxide. The dopant added to the insulator of the switching layer 20 is an impurity that contributes to the electrical conduction in the insulator. If the material of the switching layer 20 is a silicon oxide, the dopant added to the silicon oxide is phosphorus, arsenic, sulfur, selenium, antimony and tellurium. Note that types or kinds of the dopant added to the silicon oxide serving as the switching layer 20 are not limited to these exemplary elements.

The switching layer 20 therefore includes at least one of phosphorus, arsenic, sulfur, selenium, antimony and/or tellurium.

Note that as long as the switching layer 20 includes at least one of phosphorus, arsenic, sulfur, selenium, antimony and/or tellurium, the switching layer 20 may be formed of a material other than this exemplary material, and such other material may be a conductive or insulating oxide, a conductive or insulating nitride, or a semiconductor.

Each of the hydrogen storing layers 210 (210a and 210b) is a layer including at least one selected from lithium (Li), sodium (Na), magnesium (Mg), calcium (Ca), titanium (Ti), and/or lanthanum (La). The hydrogen storing layer 210 may be a layer made of a single element, such as a lithium layer, a sodium layer, a magnesium layer, a calcium layer, a titanium layer, or a lanthanum layer. The hydrogen storing layer 210 may be a lithium alloy layer, a sodium alloy layer, a magnesium alloy layer, a calcium alloy layer, a titanium alloy layer, or a lanthanum alloy layer. The hydrogen storing layer 210 may instead be a lithium compound layer, a sodium compound layer, a magnesium compound layer, a calcium compound layer, a titanium compound layer, or a lanthanum compound layer. Note that the hydrogen storing layer 210, when it is a layer made of a single element, does not need to have a purity (an element concentration) of 100%.

Examples which may be used as each hydrogen storing layer 210 include a magnesium layer, a magnesium-nickel (Ni) alloy layer (such as an $Mg_2Ni$ layer), and a magnesium-copper (Cu) alloy layer (such as an $Mg_2Cu$ layer). The magnesium layer serving as the hydrogen storing layer 210 does not need to contain magnesium at a purity of 100%, but it may contain unintended impurities as long as the chemical characteristics of magnesium (e.g., capability of adsorbing and/or storing hydrogen) are retained.

Each hydrogen storing layer 210 may include multiple layers. In this case, at least one of these multiple layers of the hydrogen storing layer 210 includes at least one selected from lithium, sodium, magnesium, calcium, titanium, and/or lanthanum.

The hydrogen storing layer 210 adsorbs hydrogen or stores hydrogen within the layer 210.

As such, the hydrogen storing layer 210 may further include hydrogen (H) in addition to at least one selected from lithium, sodium, magnesium, calcium, titanium, and/or lanthanum described above. The hydrogen storing layer 210 may also contain a compound (a hydrogen compound) of hydrogen with an element or elements used for the hydrogen storing layer 210 described above, i.e., at least one selected from lithium, sodium, magnesium, calcium, titanium, and/or lanthanum.

The hydrogen storing layer 210 varies its properties according to the types or kinds of elements and materials described above.

For example, the quantity of hydrogen that can be stored in the hydrogen storing layer 210 varies according to the element and material used for this hydrogen storing layer 210.

The hydrogen storing layer 210 made of the above element or elements and material may have reversibility in terms of the hydrogen adsorbing and/or storing behavior. For example, the hydrogen storing layer 210 could release stored hydrogen under a given condition (e.g., an ambient temperature condition). To prevent the release of hydrogen due to temperature conditions, the hydrogen storing layer 210 preferably has a high hydrogen-releasing temperature. This enables the hydrogen storing layer 210 to prevent hydrogen from being detached from the hydrogen storing layer 210, and to accordingly maintain its hydrogen storing state.

Note that since the hydrogen storing layer 210 is a constituting member (a part) of the corresponding electrode 21, it is preferable that the hydrogen storing layer 210 be conductive also in the state where hydrogen is contained in its layer 210.

The oxidation preventing layers 211 and 212 are each constituted by at least one selected from a layer including (containing) carbon (C) (e.g., a carbon layer), a layer including nitrogen (N) and carbon (e.g., a carbon nitride layer), a layer including nitrogen and titanium (e.g., a titanium nitride (TiN) layer), a layer including nitrogen and tantalum (Ta) (e.g., a tantalum nitride (TaN) layer), a layer including tungsten (W) (e.g., a tungsten layer), a layer including nitrogen and tungsten (e.g., a tungsten nitride (WN) layer), and/or a layer including platinum (Pt) (e.g., a platinum layer). Each of the oxidation preventing layers 211 and 212 may include multiple layers.

The oxidation preventing layers 211 and 212 prevent and suppress oxidation of the hydrogen storing layer 210.

The switching layer 20 has a thickness t0 in the Z direction (a dimension in the Z direction). The hydrogen storing layer 210 has a thickness t1 in the Z direction (a dimension in the Z direction). The oxidation preventing layer 211 has a thickness t2 in the Z direction (a dimension in the Z direction). The oxidation preventing layer 212 has a thickness t3 in the Z direction (a dimension in the Z direction).

For example, when the thickness t0 of the switching layer 20 is a value within the range of 5 nm to 40 nm, it is preferable that the thickness t1 of the hydrogen storing layer 210 be a value within the range of 1 nm to 20 nm and also equal to or smaller than the thickness t0. In this case, each of the thicknesses t2 and t3 of the respective oxidation preventing layers 211 and 212 is preferably a value within the range of 1 nm to 5 nm and also equal to or smaller than the thickness t1.

In an exemplary implementation, when the thickness t0 of the switching layer 20 is 10 nm, the thickness t1 of the hydrogen storing layer 210 is 5 nm. The thicknesses t2 and t3 of the respective oxidation preventing layers 211 and 212 in this case are each 3 nm.

Note that the thickness t2 of the oxidation preventing layer 211 may be different from the thickness t3 of the oxidation preventing layer 212. Also, the thickness t1 of the oxygen storing layer 210a in the lower electrode 21A may be equal to or different from the thickness t1 of the oxygen storing layer 210b in the upper electrode 21B. The thickness t2 of the oxidation preventing layer 211a in the lower electrode 21A may be equal to or different from the thickness t2 of the oxidation preventing layer 211b in the upper electrode 21B. The thickness t3 of the oxidation preventing layer 212a in the lower electrode 21A may be equal to or different from the thickness t3 of the oxidation preventing layer 212b in the upper electrode 21B.

The hydrogen storing layer 210 could deteriorate or lose the hydrogen adsorbing and/or storing function due to oxidation or nitriding of its constituting member (e.g., magnesium). The elements that may be used for the hydrogen storing layer 210 described above, such as lithium, sodium, magnesium, calcium, titanium, and lanthanum, are, according to their electronegativity, easily bonded to oxygen (O) (or nitrogen (N)).

According to the embodiment, the oxidation preventing layers 211 and 212 are arranged adjacent to the hydrogen storing layer 210 in the electrode 21 so that the oxidation preventing layers 211 and 212 can prevent the oxidation (or nitriding) of the hydrogen storing layer 210.

Therefore, the MRAM 100 according to the embodiment can secure the hydrogen adsorbing and/or storing function of the hydrogen storing layer 210.

The MRAM 100 according to the embodiment, with the electrode 21 including the hydrogen storing layer 210, can suppress the bonding between the constituting element or elements in the switching layer 20 (phosphorus, arsenic, selenium, etc.) and hydrogen.

Consequently, the MRAM 100 according to the embodiment can suppress the degradation of characteristics of the switching element 2, and also defects in the switching element 2.

<Hydrogen Storage Model>

Figure 8:
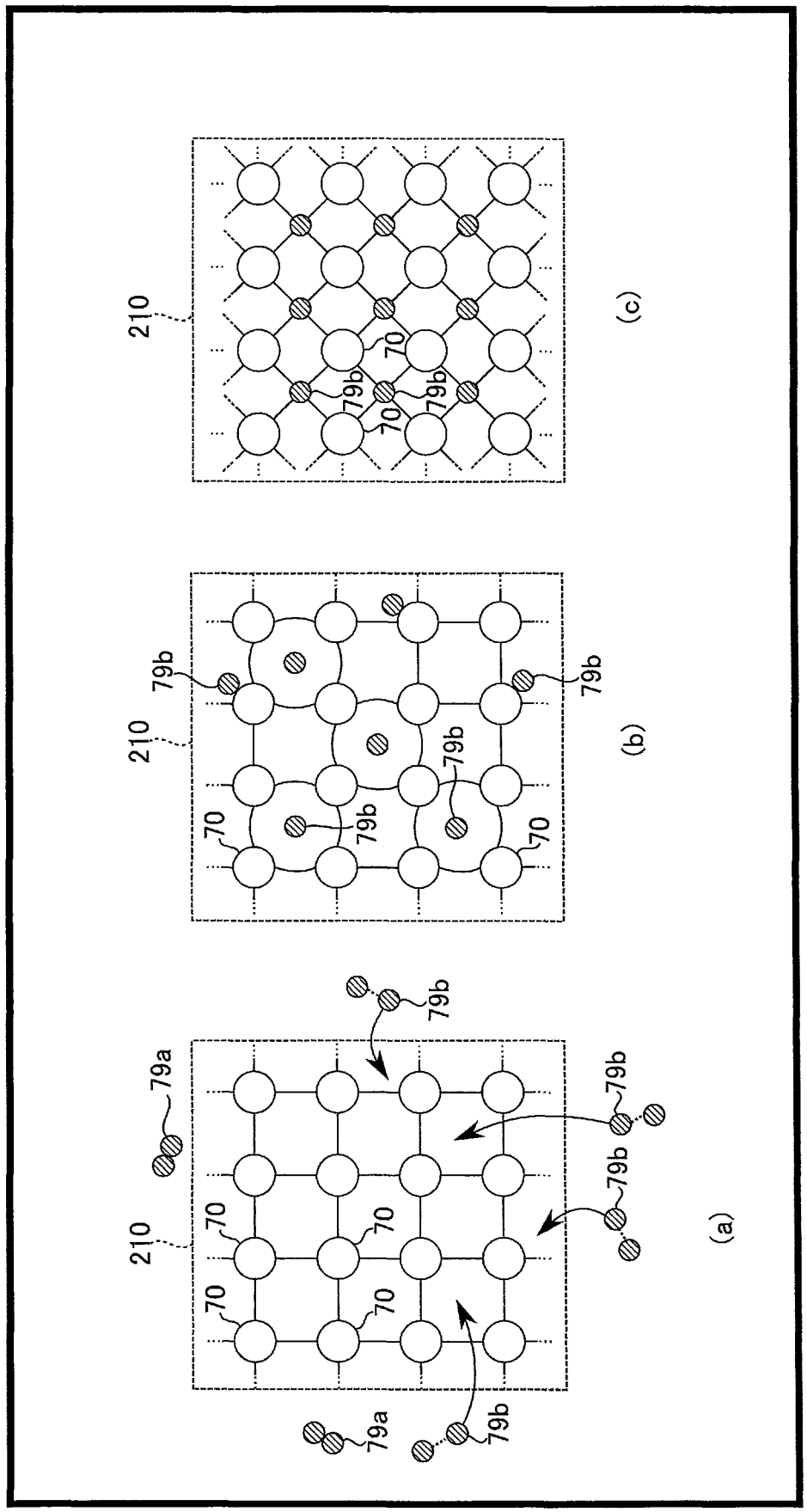
FIG. 8 is a diagram for explaining the switching element in the memory device according to the embodiment.

FIG. 8 will be referred to for describing an exemplary model of the hydrogen adsorption and storage in hydrogen storing layer 210 of the switching element 2 in the MRAM 100 according to the embodiment. In FIG. 8, illustrations (a), (b), and (c) show the mechanism of how the hydrogen storing layer 210 adsorbs and stores hydrogen in the MRAM 100 according to the embodiment.

Processes performed during the manufacture of the MRAM 100, for example, formation of insulation layers 60 and 61 or an organic substance layer, often cause hydrogen generation.

In the switching element 2 in the MRAM 100 according to the embodiment, the hydrogen storing layer 210 in the electrode 21 is capable of adsorbing and storing the generated hydrogen.

As shown in (a) of FIG. 8, the hydrogen storing layer 210 adsorbs hydrogen 79 (79a and 79b). For example, the hydrogen storing layer 210 dissociates molecular hydrogen 79a (i.e., a hydrogen molecule) into atomic hydrogen 79b (i.e., hydrogen atoms) by the action of a constituting atom or atoms (or a constituting element or elements) 70 of the hydrogen storing layer 20 on the surface of the layer 210.

The hydrogen storing layer 210 adsorbs the hydrogen 79b on its surface, or takes in the hydrogen 79b.

As shown in (b) of FIG. 8, each hydrogen atom 79b is placed inside the crystal lattice of the constituting atoms 70 (e.g., at the interstitial site) in the hydrogen storing layer 210. The hydrogen atom 79b may instead be placed near the constituting atom 70 by the attractive force occurring between this constituting atom 70 and the hydrogen atom 79b.

This forms a solid solution of the hydrogen atoms 79b and the constituting atoms 70 in the hydrogen storing layer 210.

As a result, the hydrogen atoms 79b can be relatively stably present in the hydrogen storing layer 210 without being detached from the vicinity of, or the inside of the crystal lattice of, the corresponding constituting atoms 70, by the hydrogen adsorbing and storing effect of the hydrogen storing layer 210 exhibited according to the characteristics of the materials of the hydrogen storing layer 210 under the ambient conditions (e.g., a dissociating pressure, a temperature, etc.) of the hydrogen storing layer 210.

When the hydrogen concentration in the hydrogen storing layer 210 increases, a chemical reaction between the constituting atoms 70 and the hydrogen atoms 79b takes place in the solid solution. This can cause the hydrogen atoms 79b to be chemically bonded to the constituting atoms 70.

Accordingly, as shown in (c) of FIG. 8, a hydrogen compound (metal hydride) is formed from the hydrogen atoms 79 and the constituting atoms 70 (e.g., metal atoms) in the hydrogen storing layer 210.

Note that the hydrogen atoms 79b and the constituting atoms 70 may be bonded to each other to form metal hydride without undergoing the above processes shown in FIGS. 8 (a) and (b).

With the hydrogen adsorption and storage model as above, the hydrogen storing layer 210 can adsorb and store hydrogen 79 in the switching element 2 in the MRAM 100 according to the embodiment.

FIGS. 9 to 12 schematically show hydrogen storing states which the electrodes 21 can take in the switching element 2 in the MRAM 100 according to the embodiment.

As shown in FIG. 9, one implementation is that each hydrogen storing layer 210 (210a or 210b) is converted in its entirety from a metal layer (e.g., an Mg layer) into a hydrogen compound layer 219A (e.g., an $MgH_2$ layer). In such an implementation, the hydrogen compound layer 219A is sandwiched between the oxidation preventing layers 211 and 212 in each electrode 21.

Note that, in the example shown in FIG. 9, the hydrogen atoms 79 may form a solid solution state by being dispersed throughout the inside of the hydrogen storing layer 210 without chemically reacting with the constituting atoms 70. In this case, the hydrogen storing layer 210 includes, in the entirety of the layer 210, a region 219A where the hydrogen is dispersed to form a solid solution (hereinafter, a "hydrogen dispersed region").

There are also implementations where, as shown in each of FIGS. 10, 11, and 12, a hydrogen-containing region is formed in a part or parts of the hydrogen storing layer 210.

As shown in FIG. 10, a hydrogen compound layer 219B (or a hydrogen dispersed region 219B) may be formed along each exposed surface of the hydrogen storing layer 210 (e.g., the side surface or surfaces of the hydrogen storing layer 210 in the X and/or Y directions).

As another implementation, a hydrogen compound layer or layers 219C (or a hydrogen dispersed region or regions 219C) may be randomly formed in the hydrogen storing layer 210 as shown in FIG. 11.

As yet another implementation, a hydrogen compound layer 219D (or a hydrogen dispersed region 219D) in a layered profile may be formed in the hydrogen storing layer 210 as shown in FIG. 12. For example, the hydrogen compound layer 219D may be formed along the interface between the corresponding hydrogen storing layer 210 and oxidation preventing layer 212, in a manner similar to the hydrogen compound layer 219D in the lower electrode 21A shown in the figure.

Note that, in contrast to the examples shown in FIGS. 9 to 11, it is also possible to form the hydrogen compound layer 219 in only one of the two electrodes 21A and 21B instead of forming it in both of the electrodes 21A and 21B in the switching element 2. Also, it is possible for the two electrodes 21A and 21B to adopt different respective arrangement conditions (formation conditions) of the hydrogen compound layers 219.

With the electrodes 21 including the above hydrogen storing layer 210 in the switching element 2, the MRAM 100 according to the embodiment can prevent and suppress the chemical reactions (compound formation) between the hydrogen 79 and the components or constituting members (constituting elements) of the switching layer 20.

It is additionally noted that the MRAM 100 according to the embodiment may perform write operations and read operations using known techniques. The description will therefore omit explanations of the write operations and read operations of the MRAM 100 according to the embodiment.

[b] Manufacturing Method

FIGS. 13 to 16 will be referred to for describing a method for manufacturing the MRAM 100 according to the embodiment.

Figure 13:
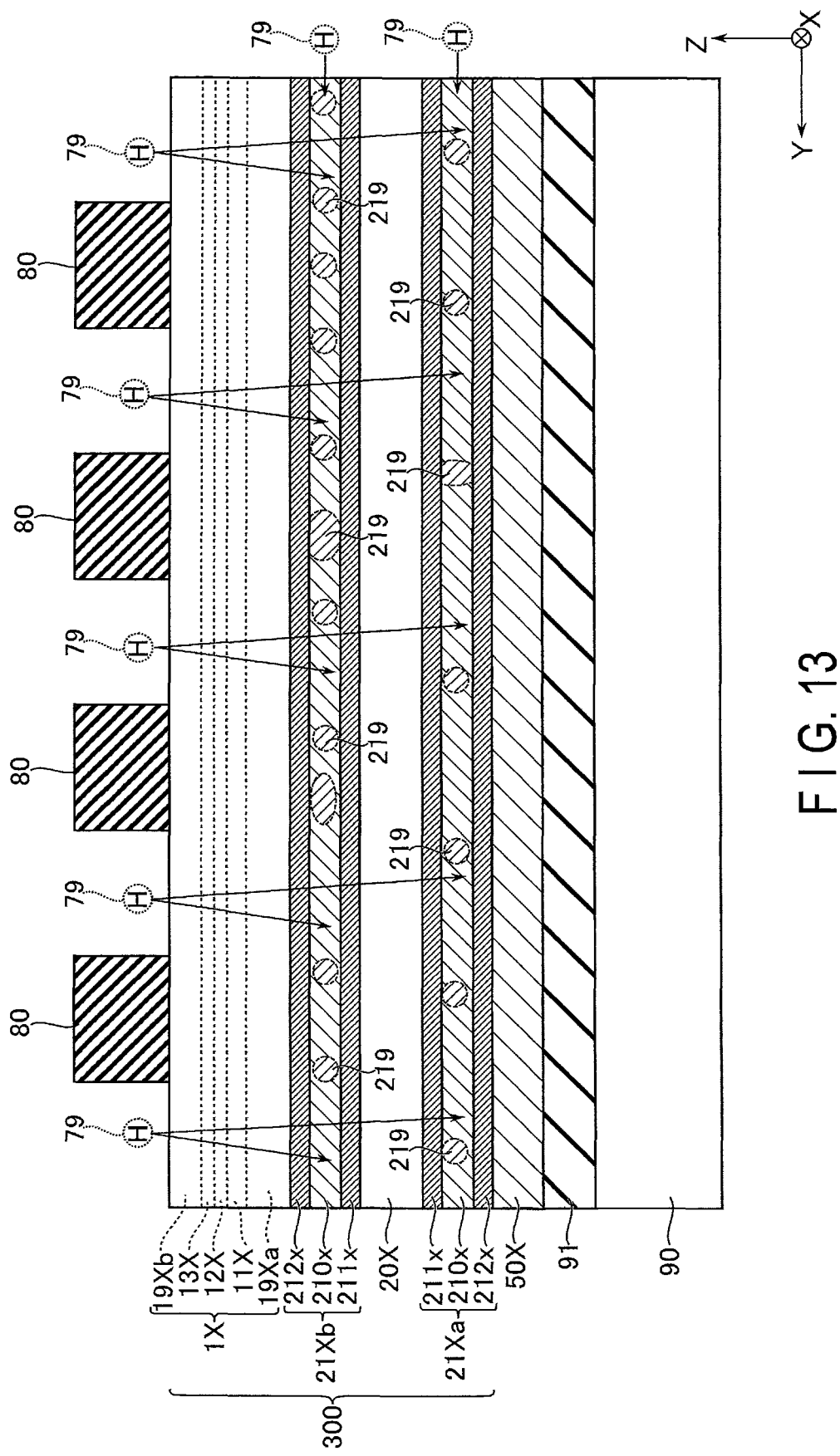
FIG. 13 is a sectional view showing one of the steps in a method for manufacturing the memory device according to the embodiment.
Figure 14:
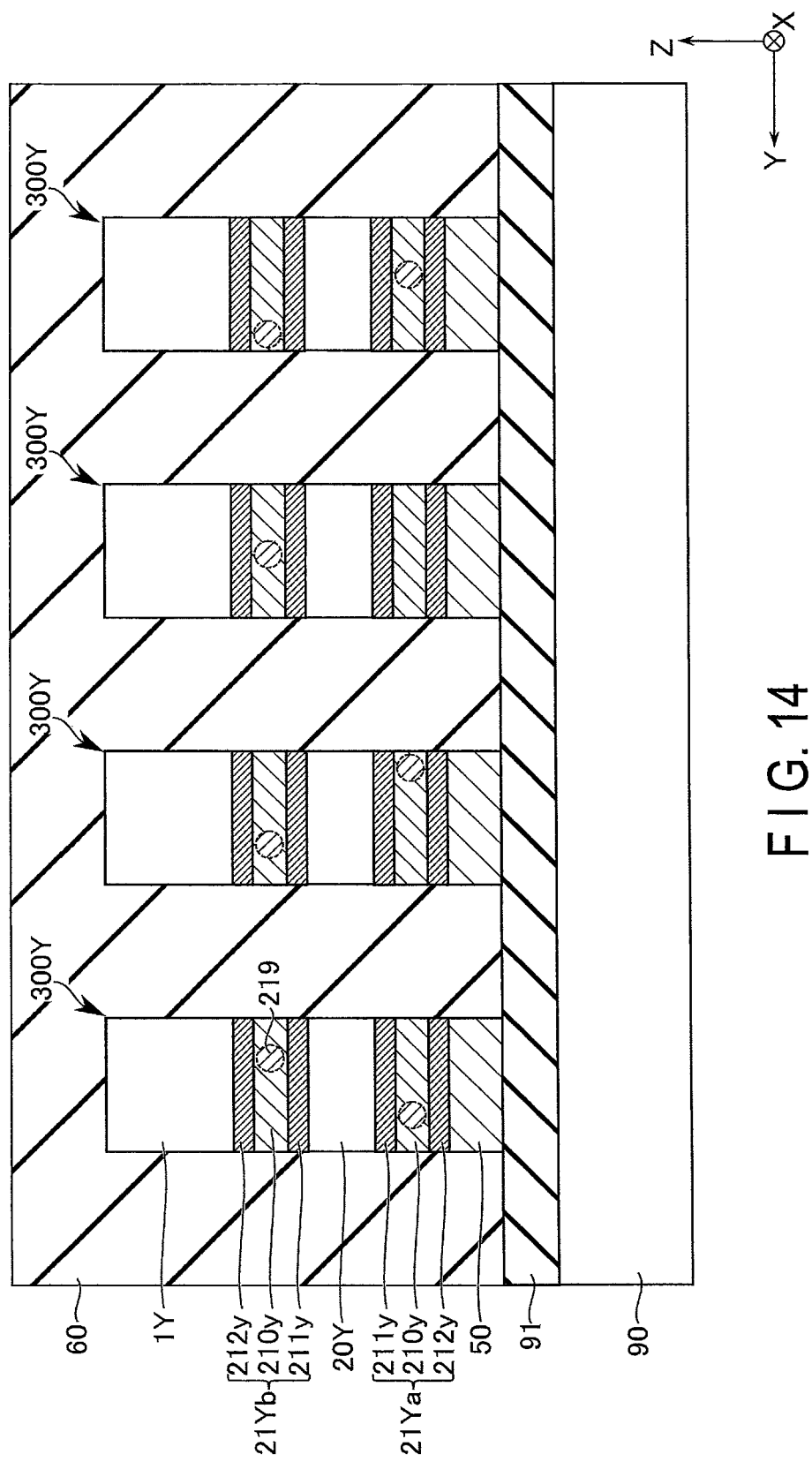
FIG. 14 is a sectional view showing one of the steps in the method for manufacturing the memory device according to the embodiment.
Figure 15:
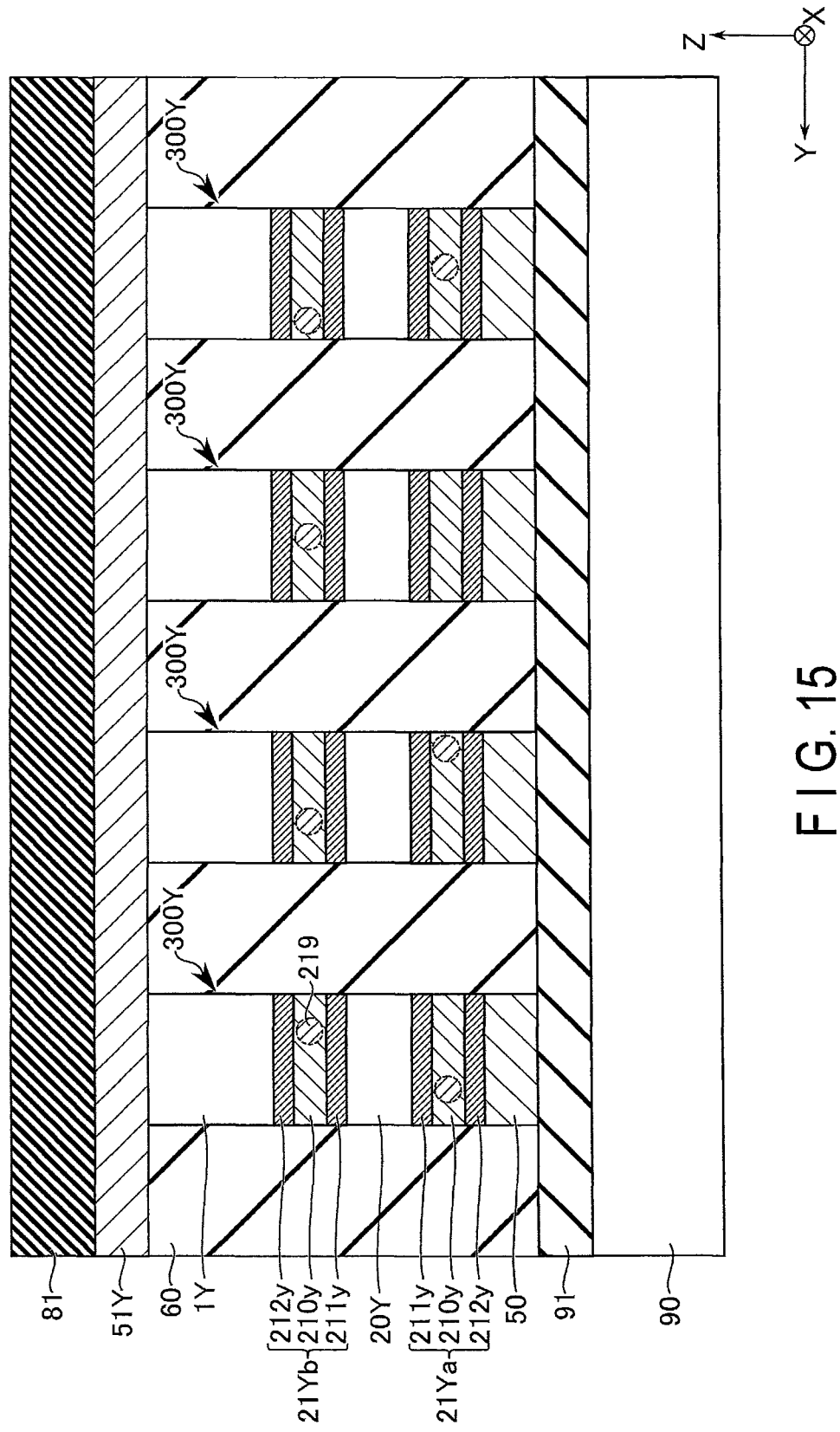
FIG. 15 is a sectional view showing one of the steps in the method for manufacturing the memory device according to the embodiment.
Figure 16:
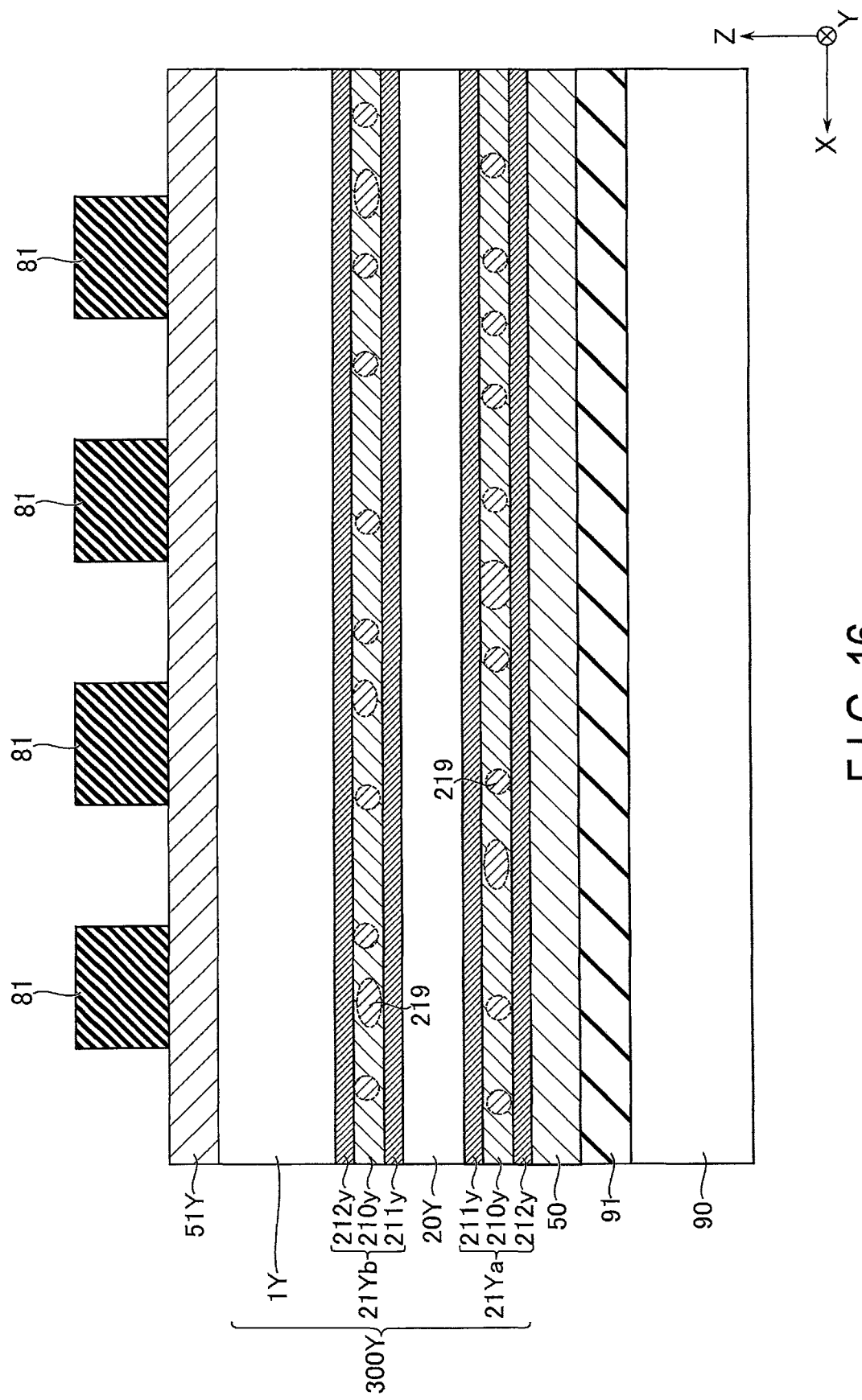
FIG. 16 is a sectional view showing one of the steps in the method for manufacturing the memory device according to the embodiment.

Each of FIGS. 13, 14, and 15 is a sectional view of the memory cell array 110 taken along the Y direction (the Y-Z plane) and shows one of the steps in the method for manufacturing the MRAM 100 according to the embodiment. FIG. 16 is a sectional view of the memory cell array 110 taken along the X direction (the X-Z plane) and shows one of the steps in the method for manufacturing the MRAM 100 according to the embodiment.

As shown in FIG. 13, the insulation layer 91 is formed on the substrate 90. If the substrate 90 is a semiconductor substrate, circuitry components in the MRAM 100, such as the row control circuit 120 and the column control circuit 130, may be formed on the semiconductor substrate 90. The insulation layer 91 covers the circuitry components formed on the semiconductor substrate 90.

A conductive layer 50X is formed on the insulation layer 91 by a sputtering method. The conductive layer 50X is a layer for word lines (bit lines).

A stack 300 is formed on the conductive layer 50X by a sputtering method or a chemical vapor deposition (CVD) method.

More specifically, multiple layers constituting the stack 300 are formed in the following manner.

A conductive layer 21Xa is formed on the conductive layer 50X. The conductive layer 21Xa is a layer for the lower electrode in the switching element 2.

A layer 20X is formed on the conductive layer 21Xa. The layer 20X is, for example, a compound layer. The layer 20X will serve as a switching layer (a variable resistive layer or a selector layer) in the switching element 2. The switching layer 20X includes (contains) at least one of phosphorus, arsenic, sulfur, selenium, antimony and/or tellurium.

A conductive layer 21Xb is formed on the switching layer 20X. The conductive layer 21Xb is a layer for the upper electrode in the switching element 2.

In the present embodiment, the conductive layers 21Xa and 21Xb each have a stack structure constituted by multiple layers $210x$, $211x$, and $212x$.

The layers $211x$ and $212x$ include at least one of a layer including carbon (e.g., a carbon layer), a layer including nitrogen and carbon (e.g., a carbon nitride layer), a layer including nitrogen and titanium (e.g., a titanium nitride layer), a layer including nitrogen and tantalum (e.g., a tantalum nitride layer), a layer including tungsten (e.g., a tungsten layer), a layer including nitrogen and tungsten (e.g., a tungsten nitride layer), and/or a layer including platinum (e.g., a platinum layer). The layers $211x$ and $212x$ serve as respective oxidation preventing layers.

The layer $210x$ includes at least one of lithium, sodium, magnesium, calcium, titanium, and/or lanthanum. The layer $210x$ is a layer employing a hydrogen storing material (that is, serves as a hydrogen storing layer). The hydrogen storing layer $210x$ is formed between the two oxidation preventing layers $211x$ and $212x$ in the Z direction.

With the oxidation preventing layers $211x$ and $212x$, the hydrogen storing layer $210x$ can be prevented from being oxidized during manufacture. The oxidation preventing layer $211x$ is formed between the hydrogen storing layer $210x$ and the switching layer 20X. In one example, when the switching layer 20X is formed of a material containing oxygen, the oxidation preventing layer $211x$ can prevent oxygen from entering (diffusing into) the hydrogen storing layer $210x$ during the formation of the switching layer 20X. Therefore, the hydrogen storing layer $210x$ can be prevented from being oxidized.

A stack 1X (also called an "MTJ stack 1X" below) for forming the MTJ element is formed on the conductive layer 21Xb.

A conductive layer 19Xa is formed on the conductive layer 21Xb. A magnetic layer 11X is formed on the conductive layer 19Xa. A non-magnetic layer 12X is formed on the magnetic layer 11X. A magnetic layer 13X is formed on the non-magnetic layer 12X. A conductive layer 19Xb is formed on the magnetic layer 13X.

In an example, the magnetic layer 11X will serve as a reference layer. The magnetic layer 13X will serve as a storage layer. The non-magnetic layer 12X will serve as a tunnel barrier layer. The conductive layers 19Xa and 19Xb will serve as electrodes in the MTJ element.

Note that layers other than the layers 11X, 12X, 13X, 19Xa, and 19Xb (e.g., a magnetic layer for forming a shift cancellation layer, a non-magnetic layer for forming a cap layer or a buffer layer, etc.) may also be formed in the MTJ stack 1X.

For example, the oxidation preventing layer $212x$ in the conductive layer 21Xb can prevent the hydrogen storing layer $210x$ from being oxidized during the formation of the MTJ stack 1X.

Multiple mask layers 80 with a given pattern are formed on the stack 300 by a lithography process. In an example, the mask layers 80 each have a linear shape extending in the X direction. A slit (an opening) is formed between the mask layers 80 that are next to each other in the Y direction. The multiple mask layers 80 are arranged along the Y direction at predetermined pitches (intervals).

The mask layers 80 each include a hard mask (e.g., a silicon oxide layer or a silicon nitride layer) and/or a resist layer (e.g., an organic substance layer). The formation of the mask layers 80 tends to cause hydrogen generation. Since hydrogen has a relatively small atomic radius, the generated hydrogen enters the stack 300 and moves inside the stack 300.

In the present embodiment as described above and with reference to FIG. 8, the hydrogen 79 generated during manufacture is adsorbed by the hydrogen storing layer $210x$ and stored in the hydrogen storing layer $210x$. For example, hydrogen-containing portions 219 (hydrogen compound layers, solid solution regions, or the like) are formed in each hydrogen storing layer $210x$. The hydrogen storing layer $210x$ includes the hydrogen compound layers 219, or the solid solution regions 219 formed of hydrogen atoms and constituting atoms (e.g., magnesium).

Therefore, the embodiment can prevent the hydrogen 79 from entering the switching layer 20X and chemically reacting with the constituting elements (e.g., phosphorus, arsenic, sulfur, selenium, antimony and/or tellurium) of the switching layer 20X. For example, the embodiment can suppress generation of volatile products (such as $PH_3$, $AsH_3$, $SbH_3$, $H_2S$, $H_2Se$, $H_2Te$ etc.) from the reaction between the hydrogen and the switching layer 20X. Consequently, the embodiment can suppress the occurrence of events where the volatile products are volatilized and become gaseous products to trigger the separation between the switching layer 20X and each conductive layer 21X (21Xa or 21Xb) or to form a gap between the switching layer 20X and each conductive layer 21X.

The embodiment can also prevent variations in characteristics of the switching element which could result from the detachment of constituting elements due to the chemical reactions between the hydrogen 79 and the switching layer 20X or the formation of hydrogen compounds in the switching layer 20X, or the like.

Note also that the oxidation preventing layers 211$x$ and 212$x$ are provided so that the hydrogen 79 adsorbed and/or stored by the hydrogen storing layer 210$x$ can be prevented from moving (or diffusing) into the switching layer 20X.

Moreover, the hydrogen storing layer 210$x$ contributes to the prevention of the chemical reactions between the constituting members of the MTJ stack 1X and the hydrogen 79.

Subsequently, the stack 300 and the conductive layer 50X are etched by, for example, an ion milling technique based on the pattern of the mask layers 80. After etching the stack 300 and the conductive layer 50X, the mask layers 80 are removed.

By subjecting the structure shown in FIG. 13 to the etching step, multiple interconnects 50 (e.g., word lines) each extending in the X direction are formed on the insulation layer 91 as shown in FIG. 14. Multiple stacks 300Y each extending in the X direction are formed on the respective interconnects 50.

Each stack 300Y includes an MTJ stack 1Y extending in the X direction. A switching layer 20Y and conductive layers 21Ya and 21Yb extend in the X direction. Each of the conductive layers 21Ya and 21Yb includes a hydrogen storing layer 210$y$ and oxidation preventing layers 211$y$ and 212$y$ which all extend in the X direction. The Y-direction side surfaces of the hydrogen storing layer 210$y$, and also the Y-direction side surfaces of the oxidation preventing layers 211$y$ and 212$y$ are exposed.

An insulation layer 60 is formed in the spaces between the interconnects 50 next to each other in the Y direction as well as in the spaces between the stacks 300Y next to each other in the Y direction.

Chemical reactions caused by a raw gas for forming the insulation layer 60 could generate hydrogen 79 (H) together with the synthesis of the insulation layer 60. The hydrogen 79 generated during the formation of the insulation layer 60 is adsorbed and/or stored by the hydrogen storing layer 210$y$.

After forming the insulation layer 60, the top face of the insulation layer 60 is flattened by conducting, for example, chemical mechanical polishing with the top faces of the MTJ stacks 1Y (conductive layers) used as stoppers, as shown in FIGS. 15 and 16.

Subsequently, a conductive layer 51Y is formed on the insulation layer 60 and the stacks 300Y by a sputtering method.

Multiple mask layers 81 with a given pattern are formed on the conductive layer 51Y by a lithography process. In an example, the mask layers 81 each have a linear shape extending in the Y direction. A slit is formed between the mask layers 81 that are next to each other in the X direction. The multiple mask layers 81 are arranged along the X direction at predetermined pitches (intervals).

As in the process explained with reference to FIG. 13, the formation of the mask layers 81 would generate hydrogen 79. The hydrogen 79 generated during the formation of the mask layers 81 is adsorbed and/or stored by the hydrogen storing layer 210$y$.

Subsequently, the conductive layer 51Y and the stacks 300$y$ are etched by, for example, an ion milling technique based on the pattern of the mask layers 81. This etching divides each of the conductive layer 51Y and the stacks 300Y into two or more segments in the X direction.

Accordingly, multiple memory cells MC are formed above the substrate 90 as shown in FIGS. 3 to 5. Multiple interconnects 51 (e.g., bit lines) each extending in the Y direction are formed above the memory cells MC. Due to this etching, the X-direction side surfaces of the hydrogen storing layer 210, and also the X-direction side surfaces of the oxidation preventing layers 211 and 212 are exposed.

Subsequently, an insulation layer 61 is formed between the memory cells MC that are next to each other in the X direction, in a manner similar to the process explained with reference to FIG. 14. Here, the hydrogen storing layer 210 adsorbs and/or stores hydrogen generated by the formation of the insulation layer 61.

As an outcome of the manufacturing method described above, one or more hydrogen compound layers 219 (or one or more hydrogen dispersed regions 219) can be formed in the hydrogen storing layer 210 as shown FIGS. 9 to 12.

Subsequently, an insulation layer 62 is formed on the interconnects 51 and the insulation layers 60 and 61.

By undergoing the above steps, the memory cell array 110 in the MRAM 100 according to the embodiment is fabricated.

Thereafter, known manufacturing processes are performed as appropriate to complete the MRAM 100 according to the embodiment.

[c] In Sum

An MRAM manufacturing process involves steps where a constituting member of the switching element in a memory cell could be exposed to a hydrogen-containing gas atmosphere.

A constituting member (e.g., a switching layer) of the switching element often includes a material or materials that can easily react with hydrogen.

The constituting element or elements (e.g., phosphorus, arsenic, sulfur, selenium, antimony and tellurium) contained in the switching layer reacts with hydrogen to generate a hydrogen compound.

In the event where a highly volatile hydrogen compound (a compound that can easily gasify, such as $PH_3$, $AsH_3$, $SbH_3$, $H_2S$, $H_2Se$ or $H_2Te$) is generated, a hydrogen compound gas could be generated in the switching layer and discharged from the switching layer. This hydrogen compound gas could trigger the separation between the switching layer and a conductive layer (an electrode), or the formation of a gap (or a hydrogen compound gas region) between the switching layer and the conductive layer. As a result, a defect such as an opening or clearance between the electrode and the switching layer (that is, a failure in conduction between them) can occur in the switching element.

Once the constituting elements are detached from the switching layer due to generation of the hydrogen compound gas, or once the hydrogen compound is generated in the switching layer, the concentration of the constituting elements that contribute to the characteristics of the switching layer decreases. This could alter the characteristics of the switching element from the desired characteristics.

In the MRAM 100 according to the embodiment, the hydrogen storing layer 210 is provided in each electrode 21 of the switching element 2. The hydrogen storing layer 210 is formed using a hydrogen storing material. The hydrogen storing layer 210 is a layer including, for example, at least one of lithium, sodium, magnesium, calcium, titanium, and/or lanthanum.

The hydrogen storing layer 210 has high hydrogen adsorbing and storing functions as compared to the switching layer 20 as well as to other constituting members in the MRAM 100.

Therefore, the MRAM 100 according to the embodiment can prevent hydrogen from entering the switching layer 20 and chemically reacting with the constituting members of the switching layer 20.

In an exemplary implementation, the hydrogen storing layer 210 may include hydrogen as a result of the hydrogen adsorbing and/or storing behavior. In the MRAM 100 according to the embodiment, therefore, one or more hydrogen compound layers 219 (or one or more hydrogen dispersed regions 219) may be randomly provided to the hydrogen storing layer 210.

According to the embodiment, the hydrogen storing layer 210 is sandwiched between two oxidation preventing layers 211 and 212 in each electrode 21. The oxidation preventing layers 211 and 212 include at least one selected from a layer including carbon (e.g., a carbon layer), a layer including nitrogen and carbon (e.g., a carbon nitride layer), a layer including nitrogen and titanium (e.g., a titanium nitride layer), a layer including nitrogen and tantalum (e.g., a tantalum nitride layer), a layer including tungsten (e.g., a tungsten layer), a layer including nitrogen and tungsten (e.g., a tungsten nitride layer), and/or a layer including platinum (e.g., a platinum layer). The oxidation preventing layers 211 and 212 can prevent and suppress the oxidation (or nitriding) of the hydrogen storing layer 210.

If the constituting member of the hydrogen storing layer 210 is oxidized or nitrided, the hydrogen storing layer 210 could lose or deteriorate its hydrogen adsorbing and/or storing functions.

When the oxidation preventing layers 211 and 212 are arranged adjacent to the hydrogen storing layer 210 as in the embodiment, the MRAM 100 can prevent the deterioration, etc., of the functions of the hydrogen storing layer 210 which could occur due to oxidation or nitriding of the hydrogen storing layer 210.

Thus, according to the embodiment, the hydrogen storing layer 210 can keep adsorbing and storing hydrogen with a relatively high efficiency without losing or deteriorating such functions.

As described above, the MRAM 100, i.e., a memory device according to the embodiment, can prevent and suppress the occurrence of separation between the electrode and the switching layer, or the formation of a gap between the electrode and the switching layer, which could be triggered by highly volatile hydrogen compounds.

Moreover, the MRAM 100 according to the embodiment can prevent and suppress variations in characteristics of the switching element which could be triggered by the formation of hydrogen compounds in the switching layer.

Therefore, the memory device according to the embodiment realizes enhanced reliability.

(2) Modifications

Figure 18:
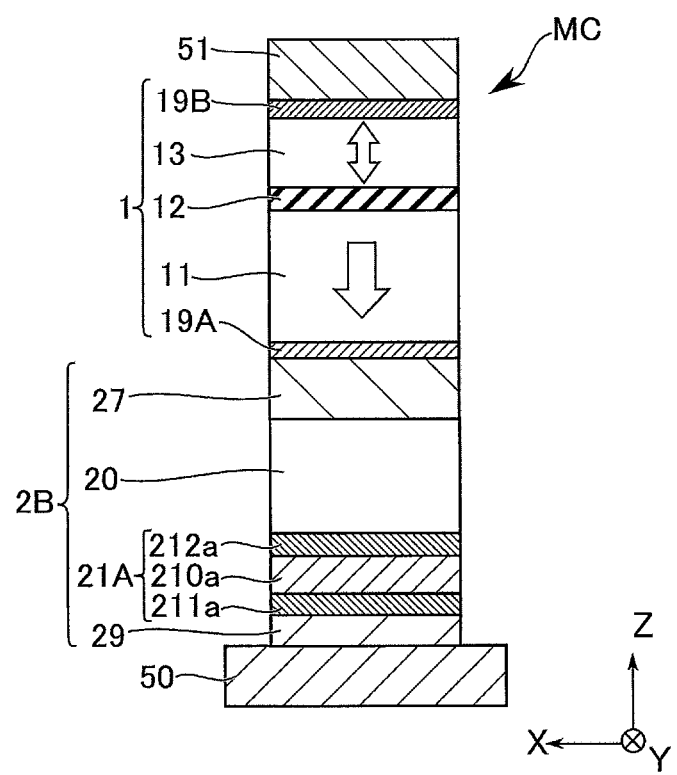
FIG. 18 is a diagram showing a modification of the memory device according to an embodiment.

FIGS. 17 to 19 will be referred to for describing exemplary modifications of the memory device 100 according to the embodiment.

FIG. 17 is a sectional view showing an example of a modification of the switching element 2 in the memory cell MC of the memory device (e.g., the MRAM 100) according to the embodiment.

As shown in FIG. 17, the switching element 2A includes two electrodes 21B and 28, and only the electrode 21B may include a hydrogen storing layer 210b and oxidation preventing layers 211b and 212b. The other electrode 28 (which is, for example, a mono-layered or multi-layered conductive layer) is a metal layer or a conductive compound layer.

FIG. 18 is a sectional view showing an example of a modification of the switching element 2 in the memory cell MC of the MRAM 100 according to the embodiment.

The example shown in FIG. 17 has assumed a structure where only the upper electrode 21B in the switching element 2A includes the hydrogen storing layer 210b and the oxidation preventing layers 211b and 212b.

However, as shown in FIG. 18, the switching element 2B may adopt a structure in which only the lower electrode 21A has a stack structure including a hydrogen storing layer 210a and oxidation preventing layers 211a and 212a, while no hydrogen storing layer 210 is included in the upper electrode 27 (which is, for example, a mono-layered or multi-layered conductive layer) of the switching element 2B. As one example, a conductive layer 29 is provided between the lower electrode 21A and the interconnect 50. Each of the upper electrode 27 and the conductive layer 29 is, for example, a metal layer or a conductive compound layer.

FIG. 19 is a sectional view showing an example of a modification of the switching element 2 in the memory cell MC of the MRAM 100 according to the embodiment.

As shown in FIG. 19, the switching element 2C includes electrodes 21C and 21D and each of these electrodes 21C and 21D may include multiple hydrogen storing layers 210 (210a and 210b) and 215 (215a and 215b).

In the lower electrode 21C, the hydrogen storing layer 215a is arranged between an oxidation preventing layer 212a and the interconnect 50. In the upper electrode 21D, the hydrogen storing layer 215b is arranged between an oxidation preventing layer 212b and the MTJ element 1.

Each hydrogen storing layer 215 may be formed of a material different from the material of the hydrogen storing layers 210. In one example, the material of the hydrogen storing layer 215 is palladium (Pd). Such a palladium layer 25 may be provided between the hydrogen storing layer 210 and the oxidation preventing layer 211, or between the hydrogen storing layer 210 and the oxidation preventing layer 212.

The MRAM 100 that includes the switching elements 2A, 2B, and/or 2C of the respective modifications described with reference to FIGS. 17 to 19 can realize the same effects as in the foregoing embodiments.

(3) Others

The description has assumed an MRAM to be an example of the memory device 100 according to each embodiment. Note, however, that the memory device 100 according to each embodiment is not limited to an MRAM but may be any memory device that employs a switching element including a hydrogen storing layer sandwiched by two oxidation preventing layers.

For example, the memory device 100 according to each embodiment may be any one of various types of memory devices, including a memory device whose memory element is a transition metal oxide element having variable resistive characteristics (e.g., a resistance-change memory such as a resistive random access memory (ReRAM)), a memory device whose memory element is a phase-change element (e.g., a phase-change memory such as a phase change random access memory (PCRAM)), and a memory device whose memory element is a ferroelectric element (e.g., a ferroelectric memory such as a ferroelectric random access memory (FeRAM)).

The memory device 100 according to each embodiment, even in the form of a memory device other than an MRAM, can likewise realize the advantages as explained in the foregoing description.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A memory device comprising:
a switching element including a first conductive layer, a second conductive layer, and a variable resistive layer between the first conductive layer and the second conductive layer; and
a memory element electrically connected in series with the switching element,
wherein
at least one of the first conductive layer or the second conductive layer includes
a first layer,
a second layer between the first layer and the variable resistive layer, and
a third layer between the first layer and the second layer,
each of the first layer and the second layer is selected from a layer including carbon, a layer including nitrogen and carbon, a layer including nitrogen and titanium, a layer including nitrogen and tantalum, a layer including tungsten, a layer including nitrogen and tungsten, and a layer including platinum, and
the third layer includes at least one selected from lithium, sodium, magnesium, calcium, titanium, or lanthanum.

2. The memory device according to claim 1, wherein the variable resistive layer includes at least one selected from phosphorus, arsenic, sulfur, selenium, antimony or tellurium.

3. The memory device according to claim 1, wherein the third layer includes hydrogen.

4. The memory device according to claim 1, wherein the third layer further includes at least one of nickel or copper when third layer includes magnesium.

5. The memory device according to claim 1, wherein the variable resistive layer includes oxygen and silicon.

6. The memory device according to claim 1, wherein the third layer includes a material adapted to adsorb or store hydrogen.

7. The memory device according to claim 1, wherein the first layer and the second layer includes a material adapted to prevent oxidation of the third layer.

8. The memory device according to claim 1, wherein
the first conductive layer is provided between the variable resistive layer and the memory element, and includes the first layer, the second layer, and the third layer,
the second conductive layer includes
a fourth layer,
a fifth layer between the fourth layer and the variable resistive layer, and
a sixth layer between the fourth layer and the fifth layer,
the fourth layer is selected from a layer including carbon, a layer including nitrogen and carbon, a layer including nitrogen and titanium, a layer including nitrogen and tantalum, a layer including tungsten, a layer including nitrogen and tungsten, and a layer including platinum,
the fifth layer is selected from a layer including carbon, a layer including nitrogen and carbon, a layer including nitrogen and tantalum, a layer including nitrogen and tungsten, and a layer including platinum, and
the sixth layer includes at least one selected from lithium, sodium, magnesium, calcium, titanium, or lanthanum.

9. The memory device according to claim 1, wherein
the memory element is a magnetoresistive effect element, and
the magnetoresistive effect element includes
a first magnetic layer having a variable magnetization direction,
a second magnetic layer having an invariable magnetization direction, and
a non-magnetic layer between the first magnetic layer and the second magnetic layer.

10. A memory device comprising:
a switching element including a first conductive layer, a second conductive layer, and a variable resistive layer between the first conductive layer and the second conductive layer; and
a memory element electrically connected in series with the switching element,
wherein
at least one of the first conductive layer or the second conductive layer includes
a first layer,
a second layer between the first layer and the variable resistive layer, and
a third layer between the first layer and the second layer,
the first layer is selected from a layer including nitrogen and carbon, a layer including nitrogen and titanium, a layer including nitrogen and tantalum, and a layer including nitrogen and tungsten,
the second layer is selected from a layer including carbon, a layer including nitrogen and carbon, a layer including nitrogen and tantalum, a layer including nitrogen and tungsten, and a layer including platinum, and
the third layer includes at least one selected from lithium, sodium, magnesium, calcium, titanium, or lanthanum.

11. The memory device according to claim 10, wherein the variable resistive layer includes at least one selected from phosphorus, arsenic, sulfur, selenium, antimony or tellurium.

12. The memory device according to claim 10, wherein the third layer includes hydrogen.

13. The memory device according to claim 10, wherein the third layer further includes at least one of nickel or copper when the third layer includes magnesium.

14. The memory device according to claim 10, wherein the variable resistive layer includes oxygen and silicon.

15. The memory device according to claim 10, wherein the third layer includes a material adapted to adsorb or store hydrogen.

16. The memory device according to claim 10, wherein the first layer and the second layer include a material adapted to prevent oxidation of the third layer.

17. The memory device according to claim 10, wherein
the first conductive layer is provided between the variable resistive layer and the memory element, and includes the first layer, the second layer, and the third layer,
the second conductive layer includes
   a fourth layer,
   a fifth layer between the fourth layer and the variable resistive layer, and
   a sixth layer between the fourth layer and the fifth layer,
the fourth layer is selected from a layer including carbon, a layer including nitrogen and carbon, a layer including nitrogen and titanium, a layer including nitrogen and tantalum, a layer including tungsten, a layer including nitrogen and tungsten, and a layer including platinum,
the fifth layer is selected from a layer including carbon, a layer including nitrogen and carbon, a layer including nitrogen and tantalum, a layer including nitrogen and tungsten, and a layer including platinum, and
the sixth layer includes at least one selected from lithium, sodium, magnesium, calcium, titanium, or lanthanum.

18. The memory device according to claim 10, wherein
the memory element is a magnetoresistive effect element, and
the magnetoresistive effect element includes
   a first magnetic layer having a variable magnetization direction,
   a second magnetic layer having an invariable magnetization direction, and
   a non-magnetic layer between the first magnetic layer and the second magnetic layer.

19. The memory device according to claim 10, wherein
the memory element is a magnetoresistive effect element, and
the magnetoresistive effect element includes
   a first magnetic layer having a variable magnetization direction,
   a second magnetic layer having an invariable magnetization direction, and
   a non-magnetic layer between the first magnetic layer and the second magnetic layer.

20. A memory device comprising:
a switching element including a first conductive layer, a second conductive layer, and a variable resistive layer between the first conductive layer and the second conductive layer; and
a memory element electrically connected in series with the switching element,
wherein
at least one of the first conductive layer or the second conductive layer includes
   a first layer,
   a second layer between the first layer and the variable resistive layer, and
   a third layer between the first layer and the second layer and including hydrogen and at least one selected from lithium, sodium, magnesium, calcium, titanium, or lanthanum.

* * * * *